(12) United States Patent
Lin et al.

(10) Patent No.: US 12,412,838 B2
(45) Date of Patent: Sep. 9, 2025

(54) INTEGRATED CIRCUIT STRUCTURE WITH FILLED RECESSES

(71) Applicant: Intel Corporation, Santa Clara, CA (US)

(72) Inventors: Kevin L. Lin, Beaverton, OR (US); Nafees A. Kabir, Portland, OR (US); James Munro Blackwell, Portland, OR (US); Rami Hourani, Beaverton, OR (US)

(*) Notice: Subject to any disclaimer, the term of this patent is extended or adjusted under 35 U.S.C. 154(b) by 933 days.

(21) Appl. No.: 16/444,438

(22) Filed: Jun. 18, 2019

(65) Prior Publication Data
US 2020/0402917 A1 Dec. 24, 2020

(51) Int. Cl.
| | |
|---|---|
| H01L 23/532 | (2006.01) |
| H01L 23/00 | (2006.01) |
| H01L 23/31 | (2006.01) |
| H01L 23/522 | (2006.01) |
| H01L 25/00 | (2006.01) |
| H01L 25/065 | (2023.01) |

(52) U.S. Cl.
CPC .... *H01L 23/53295* (2013.01); *H01L 23/3128* (2013.01); *H01L 23/5226* (2013.01); *H01L 24/09* (2013.01); *H01L 24/17* (2013.01); *H01L 25/0655* (2013.01); *H01L 25/50* (2013.01); *H01L 2224/0401* (2013.01)

(58) Field of Classification Search
CPC ........... H01L 23/53295; H01L 23/3128; H01L 23/5226; H01L 24/09; H01L 24/17; H01L 25/0655; H01L 25/50; H01L 2224/0401; H01L 257/69

USPC ......................................................... 257/690
See application file for complete search history.

(56) References Cited

U.S. PATENT DOCUMENTS

| | | | |
|---|---|---|---|
| 6,524,929 B1 * | 2/2003 | Xiang ............... | H01L 21/76264 438/479 |
| 2004/0097068 A1 * | 5/2004 | Yuasa ............... | H01L 21/31138 257/E21.241 |
| 2006/0128142 A1 * | 6/2006 | Whelan ................. | B82Y 30/00 257/E21.171 |
| 2007/0298585 A1 * | 12/2007 | Lubomirsky ..... | H01L 21/76229 257/E21.548 |
| 2010/0267231 A1 * | 10/2010 | van Schravendijk ....................... | H01L 21/67115 438/653 |

(Continued)

FOREIGN PATENT DOCUMENTS

| | | | |
|---|---|---|---|
| CN | 104218150 | * | 12/2014 |
| EP | 645808 | * | 3/1995 |
| WO | WO 2004038782 | * | 5/2004 |

*Primary Examiner* — Sheng-Bai Zhu
(74) *Attorney, Agent, or Firm* — Haley Guiliano LLP

(57) ABSTRACT

Disclosed herein are IC structures, packages, and devices that include recesses processed via selective growth. An example integrated circuit (IC) structure, includes a first dielectric material, a second dielectric material on the first dielectric material, and a recess in the second dielectric material, wherein the recess includes a bottom, a top, and sidewalls. The IC further includes a first material within the recess and at a bottom of the recess, wherein the first material includes a metal and oxygen, a self-assembled monolayer (SAM) material, or an organic material, and a second material within the recess and between the first material and the top of the recess, wherein the second material is in contact with the sidewalls of the recess.

20 Claims, 18 Drawing Sheets

(56) References Cited

U.S. PATENT DOCUMENTS

| | | | | |
|---|---|---|---|---|
| 2015/0001643 | A1* | 1/2015 | Kim | H01L 21/28229 |
| | | | | 257/410 |
| 2015/0179517 | A1* | 6/2015 | Chang | H01L 23/53295 |
| | | | | 257/758 |
| 2017/0330972 | A1* | 11/2017 | Kloster | H01L 29/66795 |
| 2018/0082942 | A1* | 3/2018 | Chawla | H01L 23/5226 |
| 2019/0252522 | A1* | 8/2019 | Thees | H01L 29/78603 |

* cited by examiner

INTEGRATED CIRCUIT STRUCTURE WITH FILLED RECESSES

BACKGROUND

Production of integrated circuit structures often involves producing one or more recesses in a material of the integrated circuit structure and filling the recesses with another material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
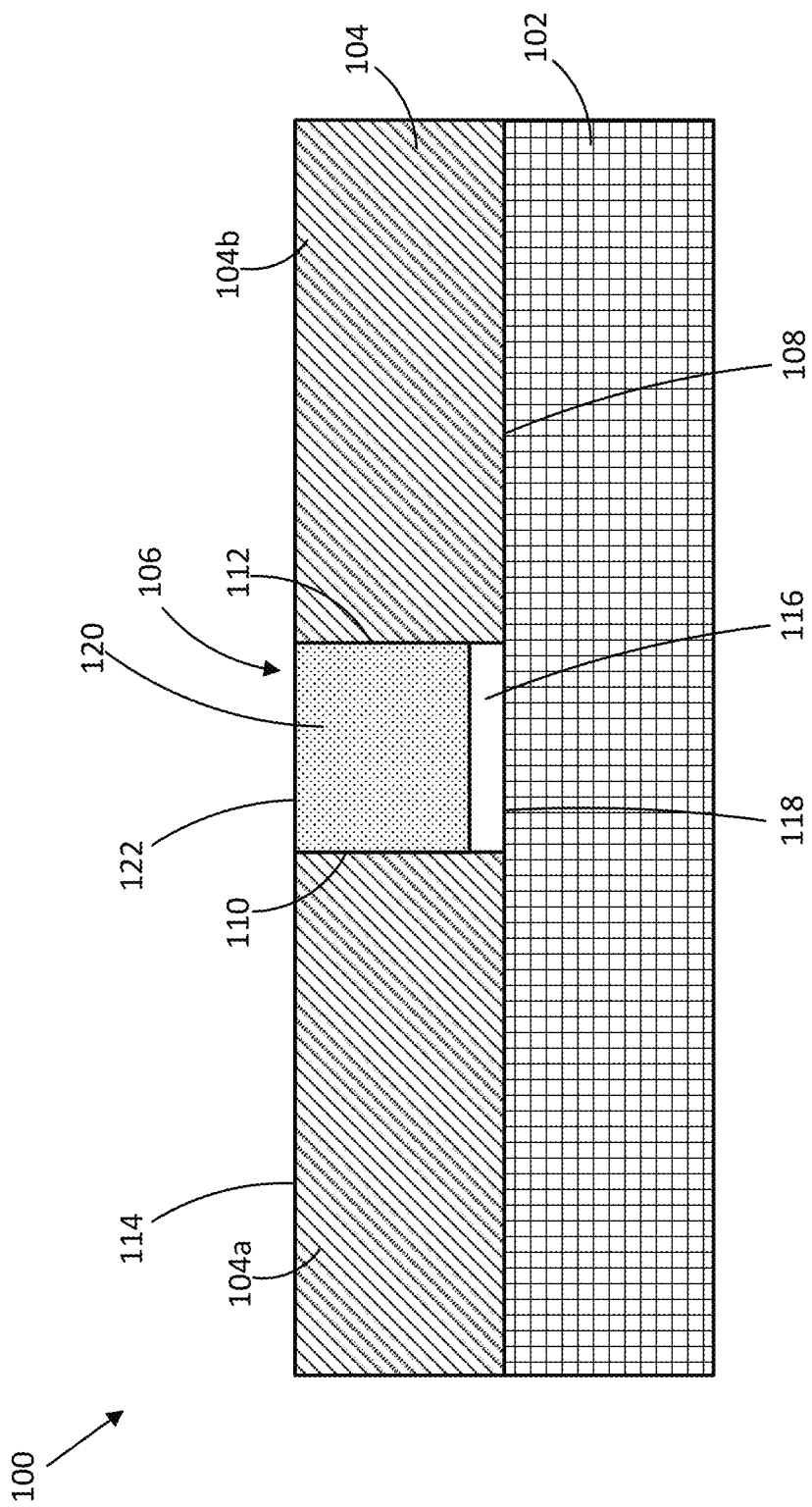
FIG. 1 illustrates an integrated circuit (IC) structure, according to some embodiments of the present disclosure.

Disclosed herein are integrated circuit (IC) structures, packages, and device assemblies that include a recess where materials within the recess, or lack thereof, are produced with a bottom-up growth procedure, which may be referred to as selective growth. Further disclosed herein are procedures incorporating angled etch or sacrificial material to produce the IC structures, packages, and device assemblies with the recess. In particular, an IC structure includes a recess formed in a dielectric material of the IC structure. A first material is disposed on the bottom and the sidewalls of the recess. An angled etch procedure, or a sacrificial material and etch procedure can be performed to remove at least a portion of the first material from the sidewalls of the recess, thereby exposing at least a portion of each of the sidewalls of the recess. A bottom-up growth procedure is performed to produce a second material on the first material, where the bottom-up growth procedure avoids producing the seams or voids that can be produced when none of the first material is removed from the sidewalls of the recess.

In one aspect of the present disclosure, an example integrated circuit (IC) structure includes a first dielectric material, a second dielectric material on the first dielectric material, and a recess in the second dielectric material, wherein the recess includes a bottom, a top, and sidewalls. The IC further includes a first material within the recess and at a bottom of the recess, wherein the first material includes a metal and oxygen, a self-assembled monolayer (SAM) material, or an organic material, and a second material within the recess and between the first material and the top of the recess, wherein the second material is in contact with the sidewalls of the recess.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," "on," and "abut" as used herein refer to a relative position of one material layer or component with respect to other layers or components. For example, one layer located over or under another layer may be directly in contact with the other layer or may have one or more intervening layers. Moreover, one layer located between two layers may be directly in contact with one or both of the two layers or may have one or more intervening layers. A first layer described to be "on" a second layer refers to the first layer that is in direct contact with that second layer or has one or more intervening layers. In contrast, a first layer described to be "abutting" a second layer refers to the first layer that is in direct contact with the that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, the IC structures as described herein may be employed as part of a chipset for executing one or more related functions in a computer.

A legacy approach to forming material within a recess of an IC structures includes depositing a conformal metal oxide layer on an entirety of the bottom and the sidewalls of the recess. Atomic layer deposition can then be utilized to form another material on the conformal metal oxide layer to fill the rest of the recess. However, the deposition of the material with the conformal metal oxide layer on the entirety of the sidewalls often results in seams or voids being formed in the material, where the material is absent in the seams or voids. The seams or voids can be sources of defects in the IC structures. For example, subsequent metal processing may penetrate into the seams and cause defects in the IC structures.

FIG. 1 illustrates an IC structure 100, according to some embodiments of the present disclosure. The IC structure 100 can be implemented in an IC die in some embodiments. The IC structure 100 may undergo further processing in IC die production where additional materials can be affixed on the top and/or bottom of the IC structure 100. A further IC component may be coupled to the IC die with the IC structure 100 in some embodiments.

The IC structure 100 includes a first dielectric material 102. The first dielectric material 102 can form a layer in some embodiments of the IC structure 100. The first dielectric material 102 may comprise a material with a high dielectric constant, such as a dielectric constant value greater than 3.9. The first dielectric material 102 may comprise a dielectric material including oxygen. For example, the first dielectric material 102 may comprise silicon dioxide (which includes silicon and oxygen), hafnium dioxide (which includes hafnium and oxygen), zirconium dioxide (which includes zirconium and oxygen), titanium dioxide (which includes titanium and oxygen), aluminum oxide (which includes aluminum and oxygen), or some combination thereof.

The IC structure 100 further includes a second dielectric material 104. The second dielectric material 104 is located on the first dielectric material 102. The first dielectric material 102 and the second dielectric material 104 may be referred to as a base assembly. The second dielectric material 104 may abut a top surface 108 of the first dielectric material 102. The second dielectric material 104 may comprise a material with a high dielectric constant, such as a dielectric constant value greater than 3.9. The second dielectric material 104 may comprise a dielectric material including oxygen or a dielectric material including nitrogen. For example, the second dielectric material 104 may comprise silicon dioxide (which includes silicon and oxygen), hafnium dioxide (which includes hafnium and oxygen), zirconium dioxide (which includes zirconium and oxygen), titanium dioxide (which includes titanium and oxygen), aluminum oxide (which includes aluminum and oxygen), aluminum nitride (which includes aluminum and nitrogen), silicon nitride (which includes silicon and nitrogen), or some combination thereof. In some embodiments, the first dielectric material 102 and the second dielectric material 104 may comprise a same dielectric material, which can be a dielectric material including oxygen or a dielectric material including nitrogen.

The second dielectric material 104 comprises a first portion 104a and a second portion 104b. A recess 106 is located between the first portion 104a of the second dielectric material 104 and the second portion 104b of the second dielectric material 104, where the second dielectric material 104 is absent from the recess 106. The recess 106 can extend from a top surface 114 of the second dielectric material 104 to the top surface 108 of the first dielectric material 102. In other embodiments, the recess can extend from the top surface 114 of the second dielectric material 104 through a portion of the second dielectric material 104 or through the second dielectric material 104 and a portion of the first dielectric material 102. The first portion 104a of the second dielectric material 104 abuts the recess 106 on a first side and the second portion 104b of the second dielectric material 104 abuts the recess 106 on a second side, the second side of the recess 106 being opposite to the first side. In these embodiments, the first portion 104a of the second dielectric material 104 defines a first sidewall 110 of the recess 106 and the second portion 104b of the second dielectric material 104 defines a second sidewall 112 of the recess 106. In other embodiments, another material may be located between the first portion 104a of the second dielectric material 104 and the recess 106, and between the second portion 104b of the second dielectric material 104 and the recess 106, as described further throughout the disclosure. In these other embodiments, the other material may define the first sidewall 110 of the recess 106 and the second sidewall 112 of the recess 106.

The IC structure 100 further includes a first material 116 located within the recess 106. The first material may comprise a metal oxide material (such as silicon oxide), a self-assembled monolayer (SAM) material, or an organic material in some embodiments. In some embodiments, the first material 116 may comprise mono-dialkylaminosilanes, bis-dialkylaminosilanes, and tris-dialkylaminosilanes (such Me2N—SiR3, (Me2N)2SiR2, (Me2N)3SiR, where R is a small alkyl such as Me, Et, Pr, or nBu), small alkyl chains or fluorinated chains and head groups (including alkoxysilanes, aminosilanes (such as (Me2N)SiMe2-SiMe2 (NMe2))), chlorosilanes; alkenes, alkynes, amines, phosphines, thiols, phosphonic acids, carboxylic acids, chlorosilanes, fluorosilanes, bromosilanes, alkoxysilanes, phosphonic acids with small chains, phosphonates with small chains, or some combination. In some embodiments, the first material 116 may comprise small alkyl chains or fluorinated chains, including alkoxysilanes, and chlorosilanes. Further, the first material 116 may be phosphonic acids and/or phosphonates in some embodiments. The first material 116 is located at a bottom 118 of the recess 106 and between the first sidewall 110 and the second sidewall 112.

The first material 116 can abut a portion of the first sidewall 110 and a portion of the second sidewall 112, where the portion of the first sidewall 110 is less than an entirety of the first sidewall 110 and the portion of the second sidewall 112 is less than an entirety of the second sidewall 112. In other embodiments, first material 116 can abut only one of the first sidewall 110 and the second sidewall 112, or may not abut either of the first sidewall 110 and the second sidewall 112. In the illustrated embodiment, the first material 116 is illustrated with a uniform thickness across the recess 106. In other embodiments, the thickness of the first material 116 may vary across the recess 106.

The IC structure 100 further include a second material 120 located within the recess 106. The second material 120 may comprise a dielectric material, (such as silicon oxide, silicon nitride, or metal oxides, including ZrO2, HfO2, and Al2O3) where the dielectric material may act as a plug. In other embodiments, the second material 120 may comprise a metal (such as Ti, TiN, Ta, TaN, Al, Cu, Co, Ru, or W), where the metal may act as a via-like structure. The second material 120 is located on the first material 116, where the first material 116 is located between the second material 120 and the first dielectric material 102. Further, the second material 120 is located between the first sidewall 110 and the second sidewall 112. The second material 120 abuts a portion of the first sidewall 110 and a portion of the second sidewall 112. In embodiments where the first material 116 abuts a portion of the first sidewall 110 and/or a portion of the second sidewall 112, the first material 116 abuts a first portion of the first sidewall 110 and a first portion of the second sidewall 112 and the second material 120 abuts a second portion of the first sidewall 110 and a second portion of the second sidewall 112, where the first material 116 and the second material 120 may collectively abut an entirety of the first sidewall 110 and an entirety of the second sidewall 112. In embodiments where the first material 116 does not abut either of the first sidewall 110 and the second sidewall 112, the second material 120 may abut an entirety of the first sidewall 110 and an entirety of the second sidewall 112. The first material 116 and the second material 120 collectively fill the recess 106, where a top surface 122 of the second material 120 is substantially aligned with the top surface 114 of the second dielectric material 104.

Figure 2:
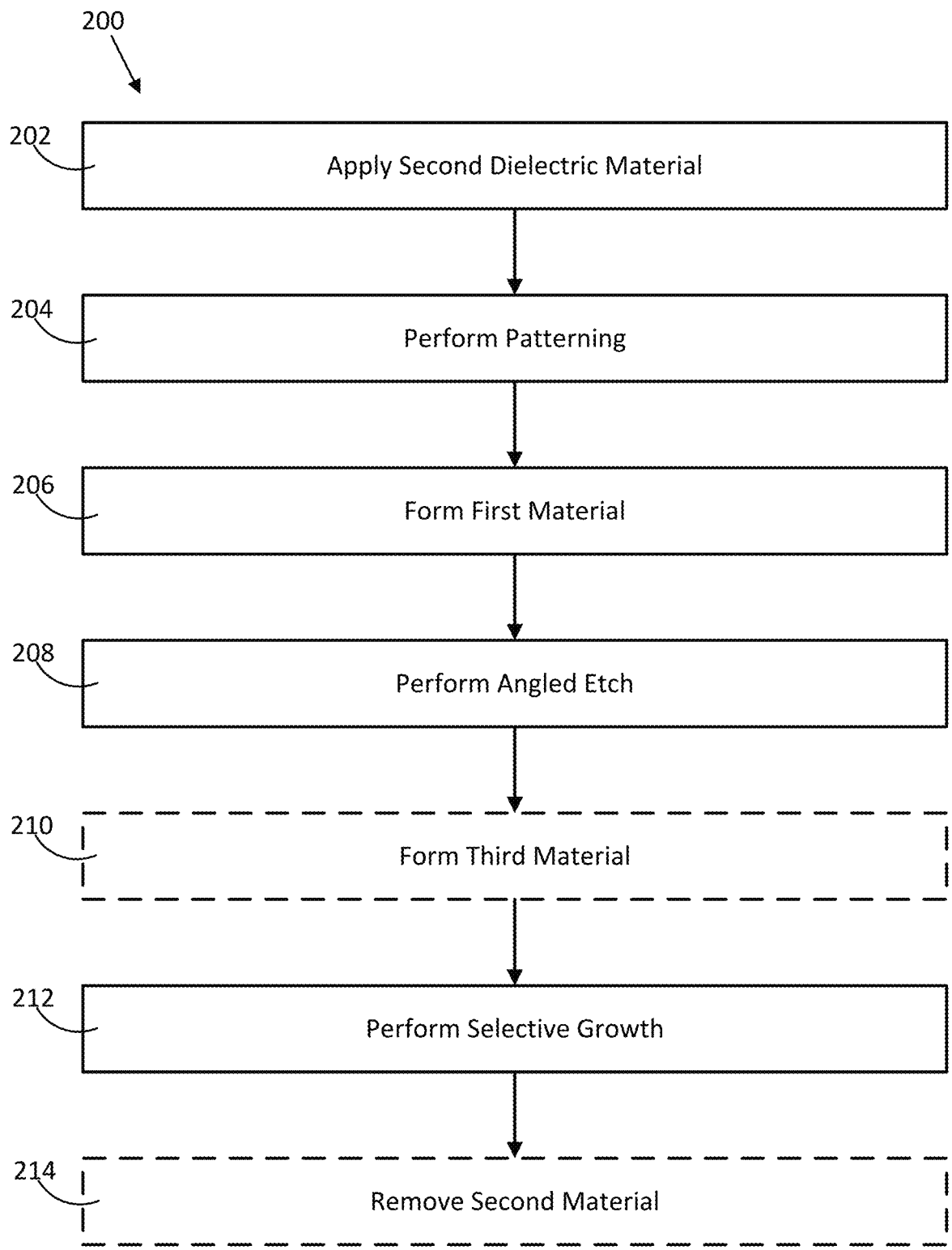
FIG. 2 illustrates a procedure for producing IC structures, according to some embodiments of the present disclosure.

FIG. 2 illustrates a procedure 200 for producing IC structures, according to some embodiments of the present disclosure. FIG. 3 through FIG. 11 illustrates IC structures corresponding to different stages of the procedure 200.

Figure 3:
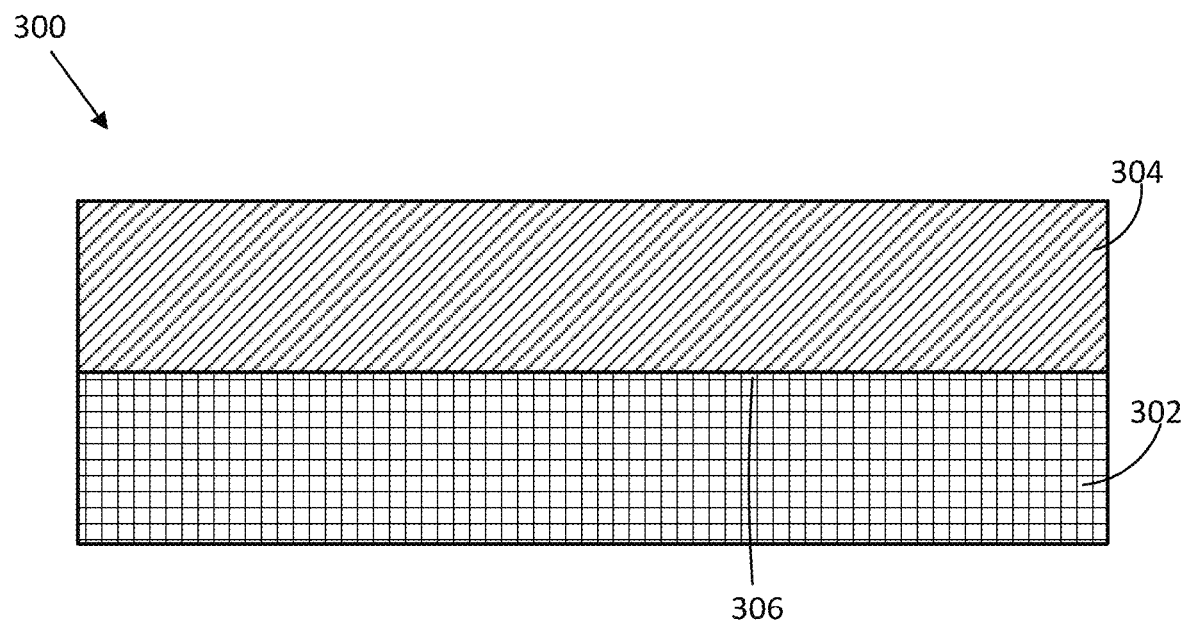
FIG. 3 illustrates an IC structure according to stage 202 of the procedure of FIG. 2, according to some embodiments of the present disclosure.

The procedure 200 can begin with a formed first dielectric material, such as the first dielectric material 302 illustrated in FIG. 3. The first dielectric material may include one or more of the features of the first dielectric material 102 (FIG. 1), including the materials of which the first dielectric material 102 may be comprised. The procedure 200 initiates with stage 202. In stage 202, a second dielectric material is applied to the first dielectric material. The second dielectric material may include one or more of the features of the second dielectric material 104 (FIG. 1), including the materials of which the second dielectric material 104 may be comprised. In particular, the second dielectric material is applied to a top surface of the first dielectric material. The second dielectric material can be applied at approximately a uniform thickness across the top surface of the first dielectric material and can extend for an entirety of the top surface of the first dielectric material. The procedure 200 may proceed from stage 202 to stage 204.

FIG. 3 illustrates an IC structure 300 according to stage 202 of the procedure 200 of FIG. 2, according to some embodiments of the present disclosure. The IC structure 300 includes a first dielectric material 302. The IC structure 300 further includes a second dielectric material 304 located on the first dielectric material 302. In particular, the second dielectric material 304 is located on a top surface 306 of the first dielectric material 302. The second dielectric material 304 extends on the top surface 306 of the first dielectric material 302 for an entirety of the top surface 306, where the second dielectric material 304 has an approximately uniform thickness for the entirety of the top surface 306.

In stage 204, patterning of the second dielectric material is performed. Patterning of the second dielectric material may include removing a portion of the second dielectric material from the top surface of the first dielectric material to produce a certain pattern. In some embodiments, patterning of the second dielectric material may include curing of a portion of the second dielectric material and removing the uncured portion of the second dielectric material or cured portion of the second dielectric material, depending on the chemical makeup of the second dielectric material and the removal procedure being applied. For the disclosed embodiments, the pattern produced by the patterning of the second dielectric material includes at least one recess. The patterned second dielectric material and the first dielectric material may be collectively referred to as a base assembly. The procedure 200 may proceed from stage 204 to stage 206.

Figure 4:
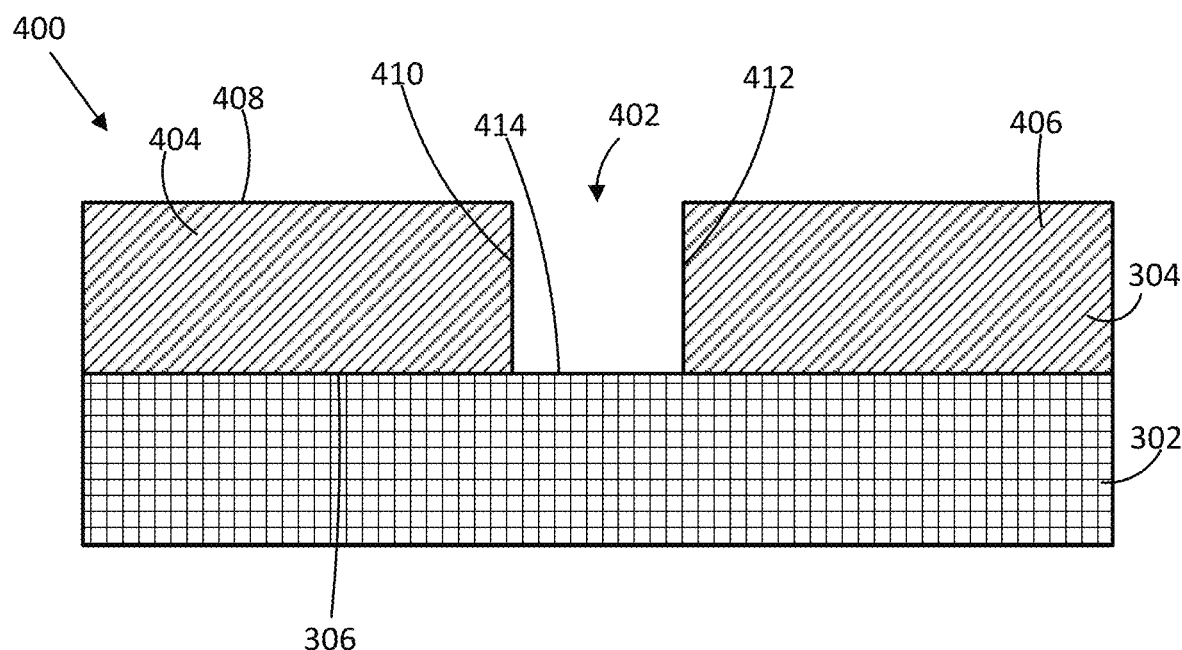
FIG. 4 illustrates an IC structure according to stage 204 of the procedure of FIG. 2, according to some embodiments of the present disclosure.

FIG. 4 illustrates an IC structure 400 according to stage 204 of the procedure 200 of FIG. 2, according to some embodiments of the present disclosure. In particular, FIG. 4 illustrates the IC structure 400 produced by stage 204 being applied to the IC structure 300 (FIG. 3) in accordance with some embodiments disclosed herein.

The performance of stage 204 caused a portion of the second dielectric material 304 to be removed. The removal of the portion of the second dielectric material 304 produces a recess 402 within the second dielectric material 304, where the recess 402 is located between a first portion 404 of the second dielectric material 304 and a second portion 406 of the second dielectric material 304. In the illustrated embodiment, the first portion 404 of the second dielectric material 304 defines a first sidewall 410 of the recess 402 and the second portion 406 of the second dielectric material 304 defines a second sidewall 412 of the recess 402. While the first sidewall 410 and the second sidewall 412 are illustrated as being straight and perpendicular to the top surface 306 of the first dielectric material 302 in the illustrated embodiment, it is to be understood that the first sidewall 410 and/or the second sidewall 412 can be curved, and/or tapered or reentrant in other embodiments. The recess 402 extends from a top surface 408 of the second dielectric material 304 to the top surface 306 of the first dielectric material 302, where the top surface 408 of the second dielectric material 304 includes a top surface of the first portion 404 and the second portion 406 of the second dielectric material 304. The top surface 306 of the first dielectric material 302 defines a bottom 414 of the recess 402. In other embodiments, the recess 402 may extend partially through the second dielectric material 304, or through the second dielectric material 304 and partially through the first dielectric material 302.

In stage 206, a first material is formed on the IC structure. The first material may include one or more of the features of the first material 116 (FIG. 1), including the materials of which the first material 116 may be comprised. In particular, the first material is formed on the top surface of the second dielectric material and within the recess at the sidewalls and the bottom of the recess. The first material may be deposited on the top surface of the second dielectric material and within the recess at the sidewalls and the bottom of the recess via a deposition procedure. The first material has a substantially uniform thickness from the surface to which it is applied (i.e., the top surface of the second dielectric material, the sidewalls of the recess, or the bottom of the recess). The procedure 200 may proceed from stage 206 to stage 208.

Figure 5:
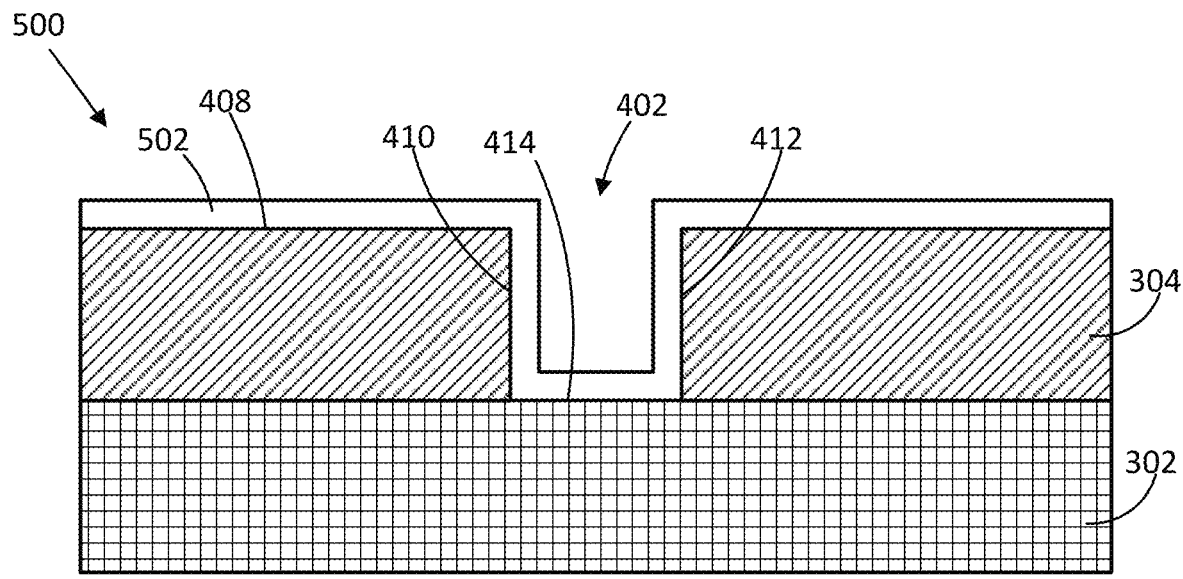
FIG. 5 illustrates an IC structure according to stage 206 of the procedure of FIG. 2, according to some embodiments of the present disclosure.

FIG. 5 illustrates an IC structure 500 according to stage 206 of the procedure 200 of FIG. 2, according to some embodiments of the present disclosure. In particular, FIG. 5 illustrates the IC structure 500 produced by stage 206 being applied to the IC structure 400 (FIG. 4) in accordance with some embodiments disclosed herein.

The IC structure 500 includes a first material 502 that has been formed on the top surface 408 of the second dielectric material 304, at the first sidewall 410 and the second sidewall 412 within the recess 402, and at the bottom 414 of the recess 402. The first material 502 abuts the top surface 408 of the second dielectric material 304, the first sidewall 410, the second sidewall 412, and the bottom 414 of the recess 402. The first material 502 has a substantially uniform thickness from the surfaces on which the first material 502 has been formed.

In stage 208, an angled etch may be performed on the IC structure. The angled etch may remove a portion of the first material formed on the IC structure in stage 206. The angled etch includes directing ions at the IC structure, where the ions are directed at a non-perpendicular angle to the bottom of the recess. In some embodiments, the angle of the ions relative to the bottom of the recess can be less than 90 degrees and greater than or equal to 60 degrees. In some embodiments, the ions may be directed at multiple angles within a predetermined distribution of angles, where the distribution can be less than 90 degrees and greater than or equal to 60 degrees in some embodiments. The angled etch can cause the portion of the first material contacted by the ions to be removed from the IC structure. In some embodiments, the ions may comprise fluorine (F) ions, where the angled etch utilizes an F+-based chemistry. In other embodiments, the ions may comprise ions of other materials utilized for etching procedures, such as chlorine (Cl) ions in a Cl+-based chemistry or bromine (Br) ions in a Br+-based chemistry. In some embodiments, traces of the ions may remain on the IC structure after the angled etch has been performed. A de-scum or de-ash procedure may be performed on the IC structure to remove the traces of the ions in some embodiments.

Figure 6:
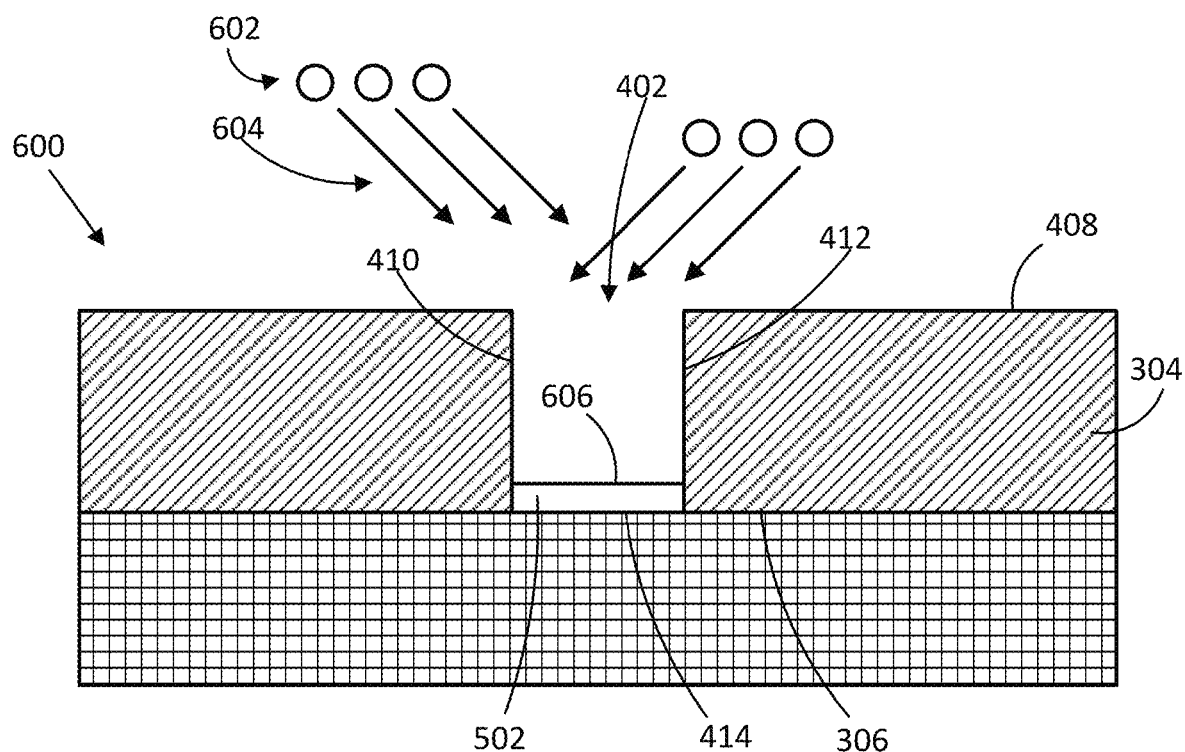
FIG. 6 illustrates an IC structure according to stage 208 of the procedure of FIG. 2, according to some embodiments of the present disclosure.

FIG. 6 illustrates an IC structure 600 according to stage 208 of the procedure 200 of FIG. 2, according to some embodiments of the present disclosure. In particular, FIG. 6 illustrates the IC structure 600 produced by stage 208 being applied to the IC structure 500 (FIG. 5) in accordance with some embodiments disclosed herein.

FIG. 6 illustrates ions 602 that are directed at the IC structure 600. Arrows 604 illustrate directions of travel of the ions 602. The ions 602 are directed at the top surface 408 of the second dielectric material 304 and are directed at angle to the bottom 414 of the recess 402. The ions 602 can contact the first material 502 located on the top surface 408 of the second dielectric material 304 and the first material 502 located on a portion of the first sidewall 410 and the second sidewall 412 (collectively referred to as "the sidewalls"). Due to the angle at which the ions 602 are directed and the second dielectric material 304, the ions 602 contact the first material 502 on the portion of the sidewalls and removes the first material 502 from the portion of the sidewalls, but blocks the ions 602 from contacting the first material 502 at the bottom 414 of the recess 402 leaving the first material 502 at the bottom 414 of the recess 402. It should be understood that the ions 602 and the arrows 604 illustrated are to illustrate the features of the angled etch, and that more ions 602 than illustrated can be directed at the IC structure 600.

The IC structure 600 illustrated is a result of stage 208 in some embodiments. In particular, the IC structure 600 illustrated can result from the ions 602 being directed such that the ions 602 contact the portion of the sidewalls above a top surface 606 of the remaining first material 502 as illustrated. The first material 502 has been removed by the ions 602 from the top surface 408 of the second dielectric material 304 and portion of the sidewalls above the top surface 606 of the remaining first material 502. Accordingly, the first material 502 is located within the recess 402 and at the bottom 414 of the recess 402 in the illustrated embodiment. Further, the first material 502 is located on the top surface 306 of the first material 502. The first material 502 extends from the first sidewall 410 to the second sidewall 412 and abuts both the first sidewall 410 and the second sidewall 412. Further, the first material 502 has approximately a uniform thickness in the illustrated embodiment.

Figure 7:
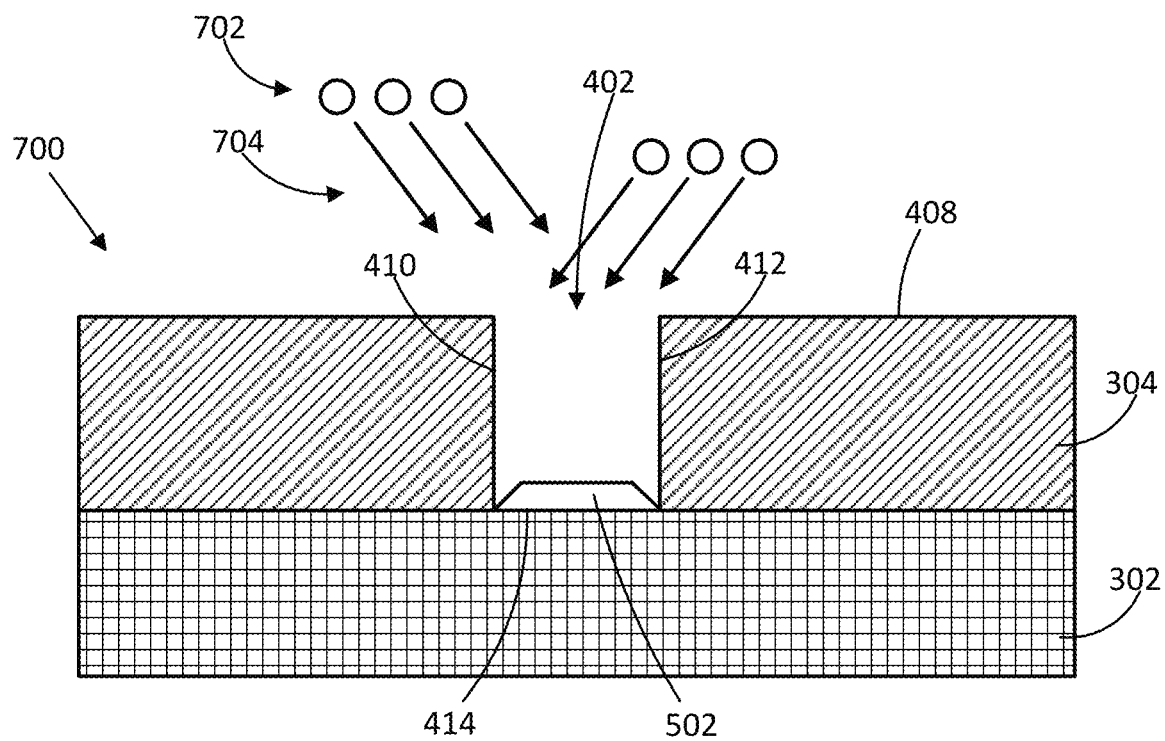
FIG. 7 illustrates another IC structure according to stage 208 of the procedure of FIG. 2, according to some embodiments of the present disclosure.

FIG. 7 illustrates another IC structure 700 according to stage 208 of the procedure 200 of FIG. 2, according to some embodiments of the present disclosure. In particular, FIG. 7 illustrates the IC structure 700 produced by stage 208 being applied to the IC structure 500 (FIG. 5) in accordance with some embodiments disclosed herein.

FIG. 7 illustrates ions 702 being directed at the IC structure 700. Arrows 704 illustrate the direction at which the ions 702 are directed at the IC structure 700. The ions 702 are directed at a top surface 408 of the second dielectric material 304 and are directed at an angle to the bottom 414 of the recess 402. In contrast to the embodiment illustrated in FIG. 6, the angle at which the ions 702 are directed to the bottom 414 of the recess 402 is greater than the angle at which the ions 602 (FIG. 6) are directed to the bottom 414 of the recess 402.

The ions 702 can contact the first material 502 located on the top surface 408 of the second dielectric material 304, the first material 502 located on the first sidewall 410 and the second sidewall 412 (collectively referred to as "the sidewalls"), and a first portion of the first material 502 located at the bottom 414 of the recess 402. Due to the angle at which the ions 702 are directed and the second dielectric material 304, the ions 702 contact the first material 502 on the sidewalls and a first portion of the first material 502 at a bottom 414 of the recess, and removes the first material 502 from the sidewalls and the first portion located at the bottom 414 of the recess 402. The ions 702 may further avoid contact with a second portion of the first material 502 located at the bottom 414 of the recess 402 and leaves the second portion of the first material 502 located at the bottom 414 of the recess 402. It should be understood that the ions 702 and the arrows 704 illustrated are to illustrate the features of the angled etch, and that more ions 702 than illustrated can be directed at the IC structure 700.

The IC structure 700 illustrated is a result of stage 208 in some embodiments. In particular, the IC structure 700 illustrated results from the ions 702 being directed such that the ions 702 contact the sidewalls and a portion of the bottom 414 of the recess 402. The first material 502 has been removed by the ions 702 from the top surface 408 of the second dielectric material 304, the sidewalls of the recess 402, and the portion of the bottom 414 of the recess 402.

Accordingly, the first material 502 is located within the recess 402 and at the bottom 414 of the recess 402 in the illustrated embodiment. Further, the first material 502 is located on the top surface 306 of the first material 502. The first material 502 extends between the first sidewall 410 to the second sidewall 412 without contacting either of the first sidewall 410 and the second sidewall 412.

Figure 8:
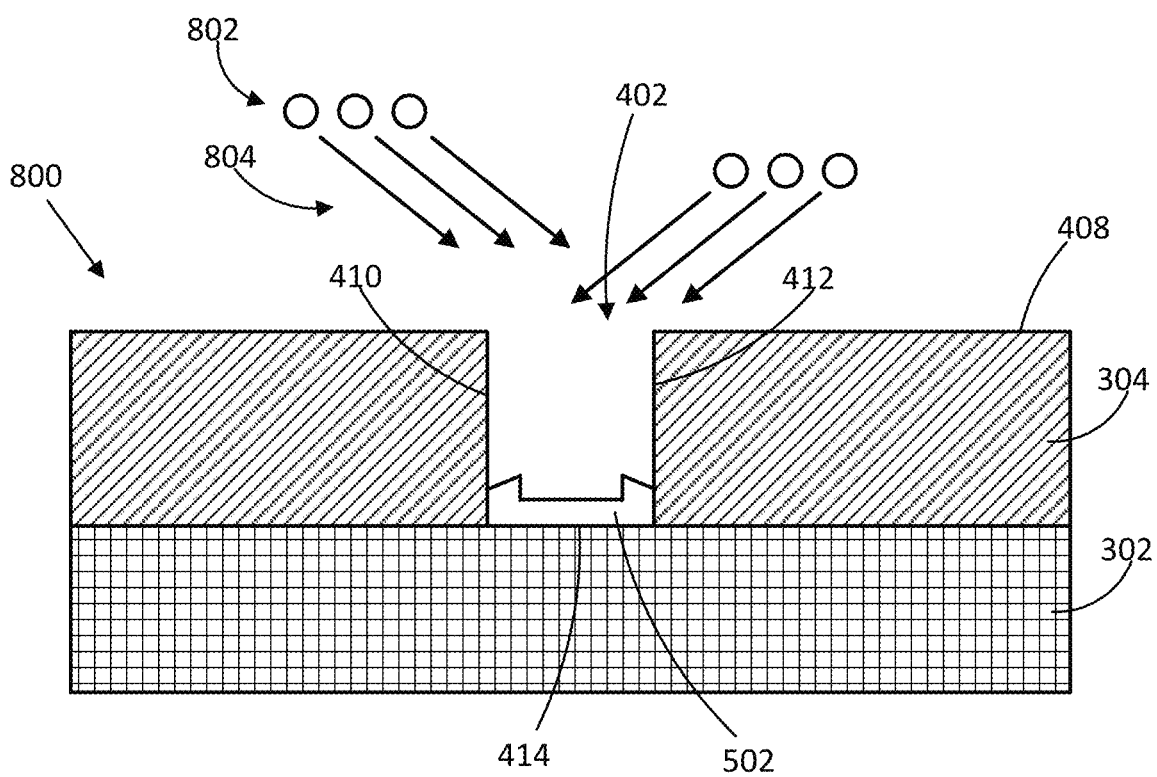
FIG. 8 illustrates another IC structure according to stage 208 of the procedure of FIG. 2, according to some embodiments of the present disclosure.

FIG. 8 illustrates another IC structure 800 according to stage 208 of the procedure 200 of FIG. 2, according to some embodiments of the present disclosure. In particular, FIG. 8 illustrates the IC structure 800 produced by stage 208 being applied to the IC structure 500 (FIG. 5) in accordance with some embodiments disclosed herein.

FIG. 8 illustrates ions 802 being directed at the IC structure 800. Arrows 804 illustrate the direction at which the ions 802 are directed at the IC structure 800. The ions 802 are directed at a top surface 408 of the second dielectric material 304 and are directed at an angle to the bottom 414 of the recess 402. In contrast to the embodiment illustrated in FIG. 6, the angle at which the ions 802 are directed to the bottom 414 of the recess 402 is less than the angle at which the ions 602 (FIG. 6) are directed to the bottom 414 of the recess 402.

The ions 802 can contact the first material 502 located on the top surface 408 of the second dielectric material 304 and a portion the first material 502 located on the first sidewall 410 and the second sidewall 412 (collectively referred to as "the sidewalls"), wherein the portion of the first material 502 located on the sidewalls is greater than the portion of the first material 502 in FIG. 6. Due to the angle at which the ions 802 are directed and the second dielectric material 304, the ions 802 contact the portion of the first material 502 on the sidewalls, and removes the portion of the first material 502 from the sidewalls. The ions 802 may further avoid contact with a second portion of the first material 502 located on the sidewalls and at the bottom 414 of the recess 402, and leaves the second portion of the first material 502 on the sidewalls and located at the bottom 414 of the recess 402. It should be understood that the ions 802 and the arrows 804 illustrated are to illustrate the features of the angled etch, and that more ions 802 than illustrated can be directed at the IC structure 800.

The IC structure 800 illustrated is a result of stage 208 in some embodiments. In particular, the IC structure 800 illustrated results from the ions 802 being directed such that the ions 802 contact a portion of the sidewalls of the recess 402. The first material 502 has been removed by the ions 802 from the top surface 408 of the second dielectric material 304, and the portion of the sidewalls of the recess 402. Accordingly, the first material 502 is located within the recess 402 and at the bottom 414 of the recess 402 in the illustrated embodiment. Further, the first material 502 is located on the top surface 306 of the first material 502. The first material 502 extends from the first sidewall 410 to the second sidewall 412 and contacts both the first sidewall 410 and the second sidewall 412. The thickness of the first material 502 near the first sidewall 410 and the second sidewall 412 is greater than the thickness of the first material 502 further away from the first sidewall 410 and the second sidewall 412.

While FIGS. 6 through 8 illustrate some examples of IC structures that may be produced by stage 208, it should be understood that other resultant IC structures may be produced based on the angle of the ions relative to the bottom 414 of the recess 402 and/or the shape (ex. thickness and/or contours) of the second dielectric material 304. Other embodiments may include any embodiments where the first material 502 has been removed from the top surface 408 of the second dielectric material 304 and at least a portion of the first material 502 on the sidewalls, while some of the first material 502 remains within the recess 402 at the bottom 414 of the recess 402.

From stage 208, the procedure 200 may proceed to stage 210 or stage 212 depending on the chemical makeup of the first material applied in stage 206. In particular, the procedure 200 proceeds to stage 210 when the first material comprises a SAM material. In other embodiments, the procedure 200 proceeds to stage 212 and bypasses stage 210.

In stage 210, a third material is formed on the IC structure. The third material may be formed on the IC structure when the first material 502 comprises a SAM material. The third material may comprise a second SAM material that is different from a SAM material of the first material. In some embodiments, the second SAM material may comprise aminosilanes (such as Me2N—SiR3, (Me2N)2SiR2, (Me2N)3SiR, where R is long chain alkyls from C8H17 to C18H37), octadecylphosphonic acid, octadecylthiol, chlorosilane, alkoxysilane (with long alkane chains (such as octadecyl trichlorosilane, trimethoxy(octadecyl)silane)) or fluorocarbon (such as triethoxy(3,3,4,4,5,5,6,6,7,7,8,8,9,9,10,10,10-heptadecafluorodecyl), and 1-(3,3,4,4,5,5,6,6,7,7,8,8,9,9,10,10,10-heptadecafluorodecyl)-N,N,N',N',N'',N''-hexamethylsilanetriamine) silane chains, hydrophobic polymer, HfO2, ZrO2, or some combination thereof. The third material is formed within the recess and attaches to the portions of the first dielectric material and/or the second dielectric material from which the first material was removed via the angled etch. The third material may attach to Si—OH groups produced on the sidewalls of the recess during the angled etch procedure.

Figure 11:
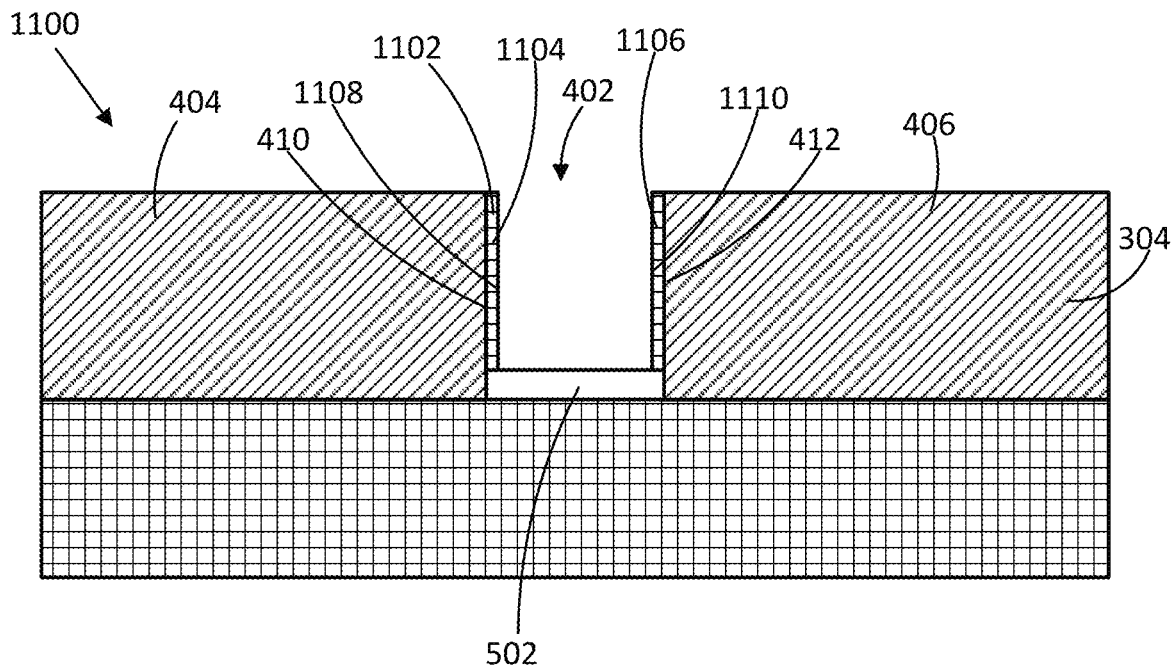
FIG. 11 illustrates an IC structure according to stage 210 of the procedure of FIG. 2, according to some embodiments of the present disclosure.

FIG. 11 illustrates an IC structure 1100 according to stage 210 of the procedure 200 of FIG. 2, according to some embodiments of the present disclosure. In particular, FIG. 11 illustrates a result of performing stage 210 on the IC structure 600 (FIG. 6). It should be understood that stage 210 can be performed on the IC structure 700 (FIG. 7) or the IC structure 800 (FIG. 8), where the third material formed in stage 210 attaches to the portions of the first dielectric material 302 and/or the second dielectric material 304 from which the first material 502 was removed on the IC structure 700 or the IC structure 800.

The IC structure 1100 includes third material 1102 located at the first sidewall 410 and the second sidewall 412. In particular, a first portion 1104 of the third material 1102 is located at the first sidewall 410 and a second portion 1106 of the third material 1102 is located at the second sidewall 412. The third material 1102 is located at the sidewalls where the first material 502 was removed in stage 208. The third material 1102 defines the sidewalls of the recess 402 when formed on the first sidewall 410 and the second sidewall 412. In particular, the third material 1102 redefines the sidewalls of the recess 402 as a first sidewall 1108 and a second sidewall 1110. The first portion 1104 of the third material 1102 is located between the first portion 404 of the second dielectric material 304 and the recess 402, and the second portion 1106 of the third material 1102 is located between the second portion 406 of the second dielectric material 304 and the recess 402, where the first sidewall 1108 defined by the first portion 1104 and the second sidewall 1110 defined by the second portion 1106 abut the recess 402. From stage 210, the procedure 200 may proceed to stage 212.

In stage 212, a selective growth procedure is performed. The selective growth procedure includes a bottom-up growth of a second material on the first material. The second material can attach to the first material and itself without attaching to the sidewalls of the recess, thereby attaching to the first material and forming outwards from the first material. The second material can grow, through attaching to the first material and itself, to fill the remainder of the recess, where the growth of the second material can prevent seams and/or voids that can occur with other recess fill procedures. The second material can comprise a dielectric material (such as SiOx, SiN, SiC, SiCN, SiOC, SiOCN, and/or metal oxides including ZrO2, HfO2, and AlO2), a metal (such as Ti, TiN, Ta, TaN, Al, Cu, Co, Ru, and/or W), a sacrificial material that can be removed in a subsequent procedure (such as TiO2, TiN, SiOx, SiN, SiC, SiCN, SiOC, SiOCN, Ti, Ta, TaN, Al, Cu, Co, Ru, W, and/or metal oxides including ZrO2, HfO2, and AlO2), or some combination thereof.

Figure 9:
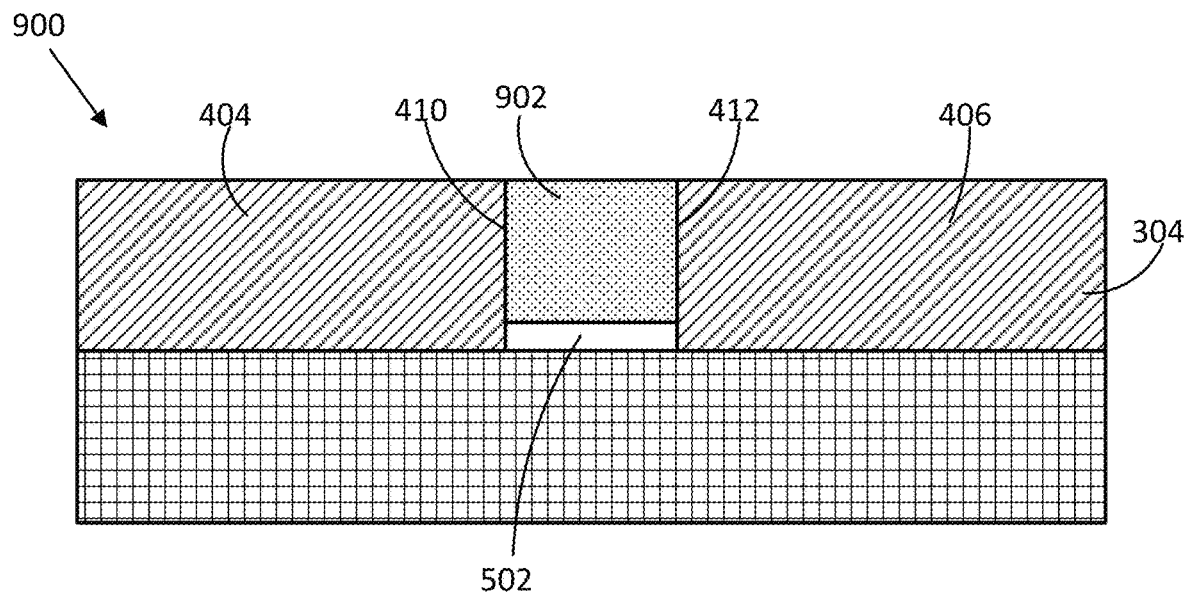
FIG. 9 illustrates an IC structure according to stage 212 of the procedure of FIG. 2, according to some embodiments of the present disclosure.

FIG. 9 illustrates an IC structure 900 according to stage 212 of the procedure 200 of FIG. 2, according to some embodiments of the present disclosure. In particular, FIG. 9 illustrates a result of performing stage 212 on the IC structure 600 (FIG. 6) in some embodiments.

The IC structure 900 includes a second material 902 located within the recess 402 (FIG. 4). The second material 902 is located on the first material 502 and abuts the first material 502. The second material 902 may have been grown on the first material 502 while not growing on the second dielectric material 304. The second material 902 further is located between the first portion 404 of the second dielectric material 304 and the second portion 406 of the second dielectric material 304. The second material 902 further abuts the first portion 404 and the second portion 406. In particular, the second material 902 is in contact with the first sidewall 410 defined by the first portion 404 of the second dielectric material 304 and is in contact with the second sidewall 412 defined by the second portion 406 of the second dielectric material 304. The second material 902 can fill the remainder of the recess 402, such that the first material 502 and the second material 902 collectively fill the recess 402.

Figure 12:
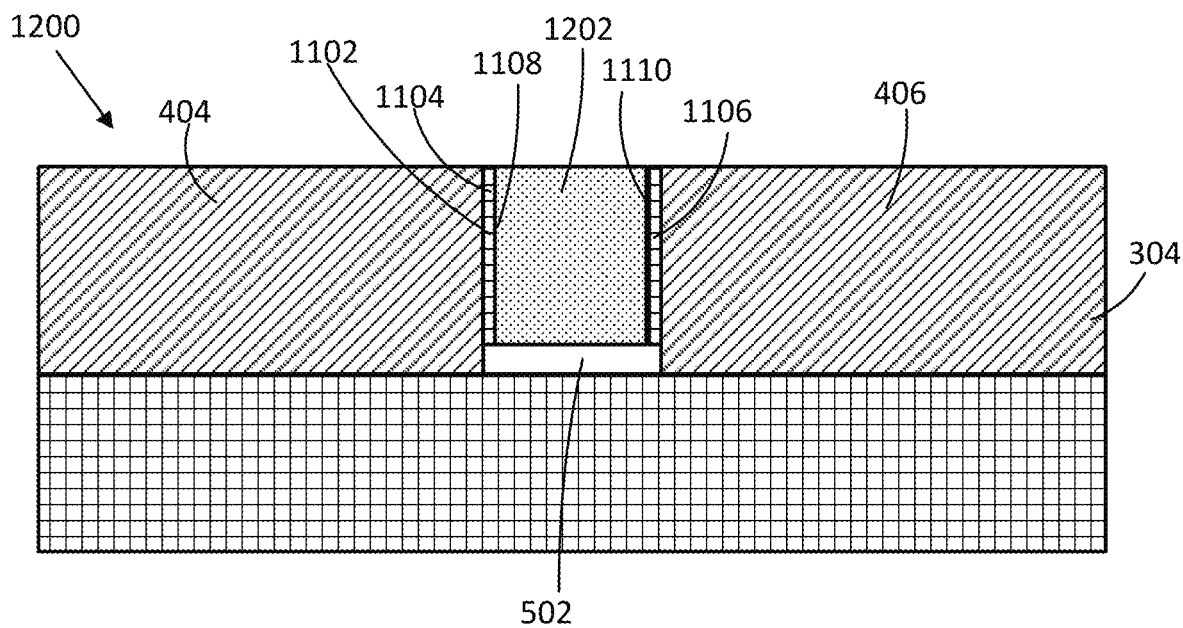
FIG. 12 illustrates another IC structure according to stage 212 of the procedure of FIG. 2, according to some embodiments of the present disclosure.

FIG. 12 illustrates another IC structure 1200 according to stage 212 of the procedure 200 of FIG. 2, according to some embodiments of the present disclosure. In particular, FIG. 12 illustrates a result of performing stage 212 on the IC structure 1100 (FIG. 11) in some embodiments.

The IC structure 1200 includes a second material 1202 located within the recess 402 (FIG. 4). The second material 1202 is located on the first material 502 and abuts the first material 502. The second material 1202 may have been grown on the first material 502 while not growing on the third material 1102. In some embodiments, the third material 1102 may have been formed to prevent the second material 1202 from attaching to the sidewalls and a material comprising the third material 1102 may have been selected to be a material to which the second material 1202 will not attach when being grown. The second material 1202 is located between the first portion 1104 of the third material 1102 and the second portion 1106 of the third material 1102, where the first portion 1104 is located between a first portion 404 of the second dielectric material 304 and the second material 1202, and the second portion 1106 is located between the second portion 406 of the second dielectric material 304 and the second material 1202. The second material 1202 abuts the first portion 1104 of the third material 1102 and the second portion 1106 of the third material 1102. In particular, the second material 1202 abuts the first sidewall 1108 defined by the first portion 1104 of the third material 1102 and the second sidewall 1110 defined by the second portion 1106 of the third material 1102. The second material 1202 can fill the remainder of the recess 402, such that the first material 502, the third material 1102, and the second material 1202 collectively fill the recess. From stage 212, the procedure 200 can proceed to stage 214. In other embodiments, the procedure 200 may finish with the completion of stage 212.

In stage 214, the second material is removed. In particular, stage 214 can be performed when the second material is a sacrificial material. In some embodiments, the first material and/or the third material may be removed with the second material in stage 214. Further procedures may be performed after stage 214 to fill the recess and/or cover the recess after the second material, the first material, and/or the third material have been removed. In some embodiments, stage 214 may be omitted.

Figure 10:
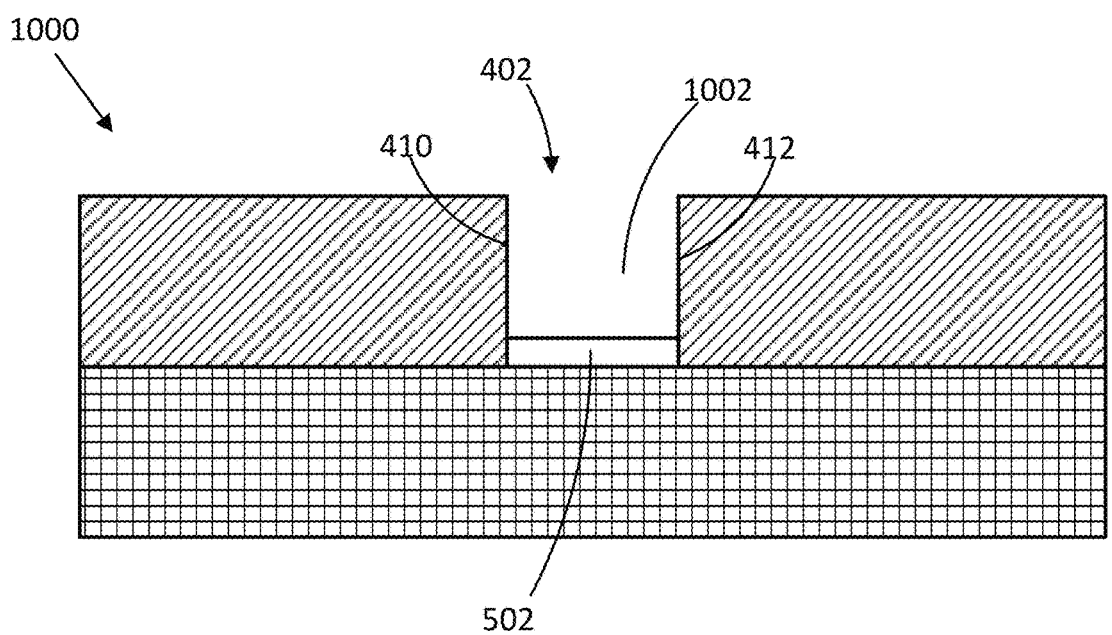
FIG. 10 illustrates an IC structure according to stage 214 of the procedure of FIG. 2, according to some embodiments of the present disclosure.

FIG. 10 illustrates an IC structure 1000 according to stage 214 of the procedure 200 of FIG. 2, according to some embodiments of the present disclosure. In particular, FIG. 10 illustrates a result of performing stage 214 on the IC structure 900 (FIG. 9). In particular, the second material 902 (FIG. 9) has been removed in the illustrated embodiment of the IC structure 1000. It should be understood that stage 214 may be performed on the IC structure 1200 (FIG. 12), where the second material 1202 (FIG. 12), the third material 1102 (FIG. 11), and/or the first material 502 (FIG. 5) may be removed from the IC structure 1200.

In the IC structure 1000 illustrated, the second material 902 had been removed. A void 1002 (i.e., lack of material) exists in the recess 402 where the second material 902 had been removed. The removal of the second material 902 exposes the first material 502, the first sidewall 410, and the second sidewall 412. The void 1002 may be filled or covered via further procedures performed on the IC structure 1000. In other embodiments, the first material 502, or some portion of, may be removed with the second material 902, where the void 1002 includes the area in the recess 402 where the second material 902 and the first material 502 were removed.

Figure 22:
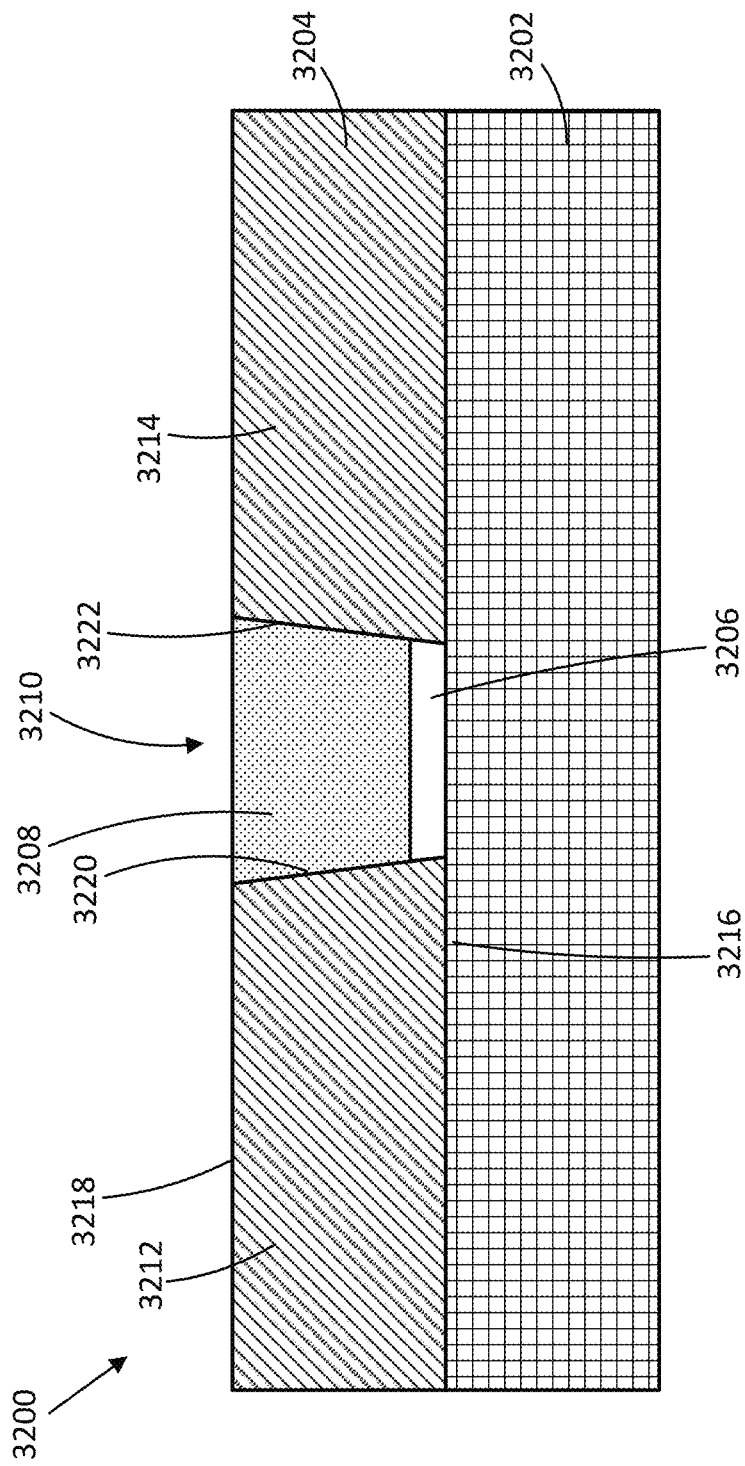
FIG. 22 illustrates another IC structure, according to some embodiments of the present disclosure.
Figure 23:
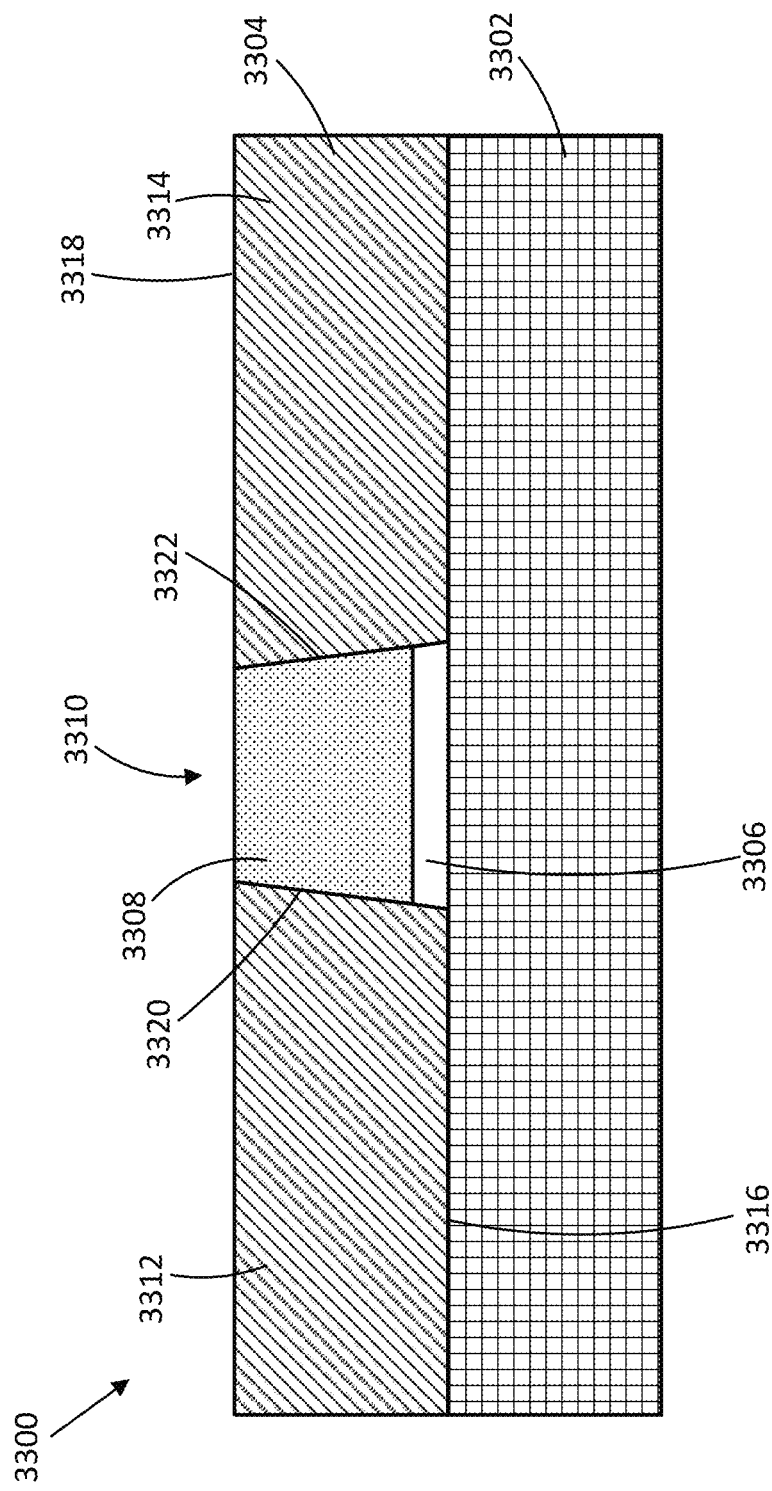
FIG. 23 illustrates another IC structure, according to some embodiments of the present disclosure.

While the figures illustrated to describe the procedure 200 are illustrated utilizing the IC structure 600 (FIG. 6) with the first material 502 being a uniform thickness, it is to be understood that the procedure 200 can produce IC structures with first material that varies in thickness. For example, the procedure 200 can be completed with the IC structure 700 (FIG. 7) and IC structure 800 (FIG. 8), where the first material 502 can have the shapes illustrated for IC structure 700 or IC structure 800 in other embodiments. Further, while the recess 402 (FIG. 4) has vertical sidewalls in the illustrated embodiment, it is to be understood that the recess 402 can be different shapes in other embodiments. For example, the recess 402 may have tapered sidewalls, as illustrated in FIG. 22, or reentrant sidewalls, as illustrated in FIG. 23, in other embodiments.

Figure 13:
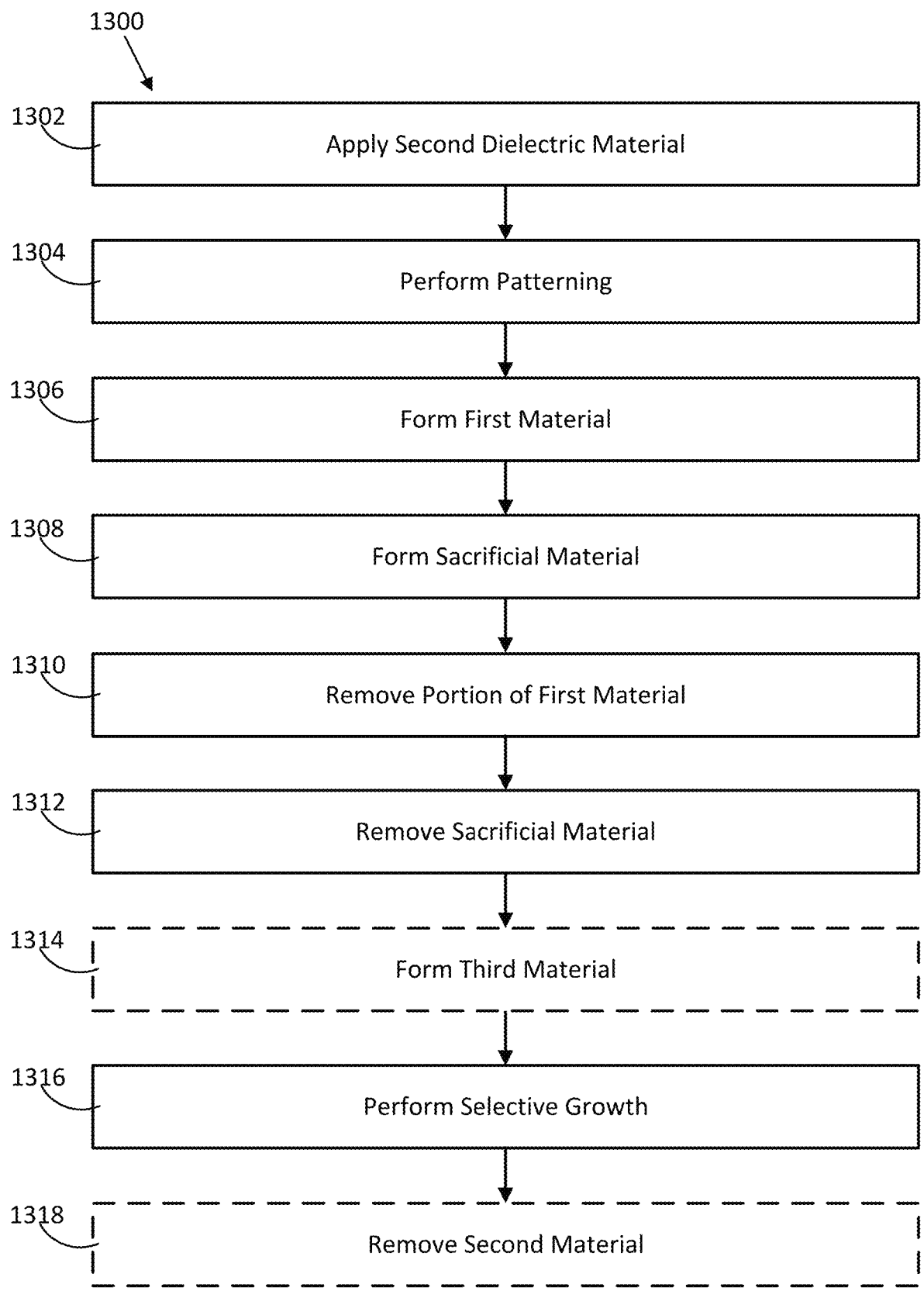
FIG. 13 illustrates another procedure for producing IC structures, according to some embodiments of the present disclosure.

FIG. 13 illustrates another procedure 1300 for producing IC structures, according to some embodiments of the present disclosure. FIG. 14 through FIG. 20 illustrates IC structures corresponding to different stages of the procedure 1300.

Figure 14:
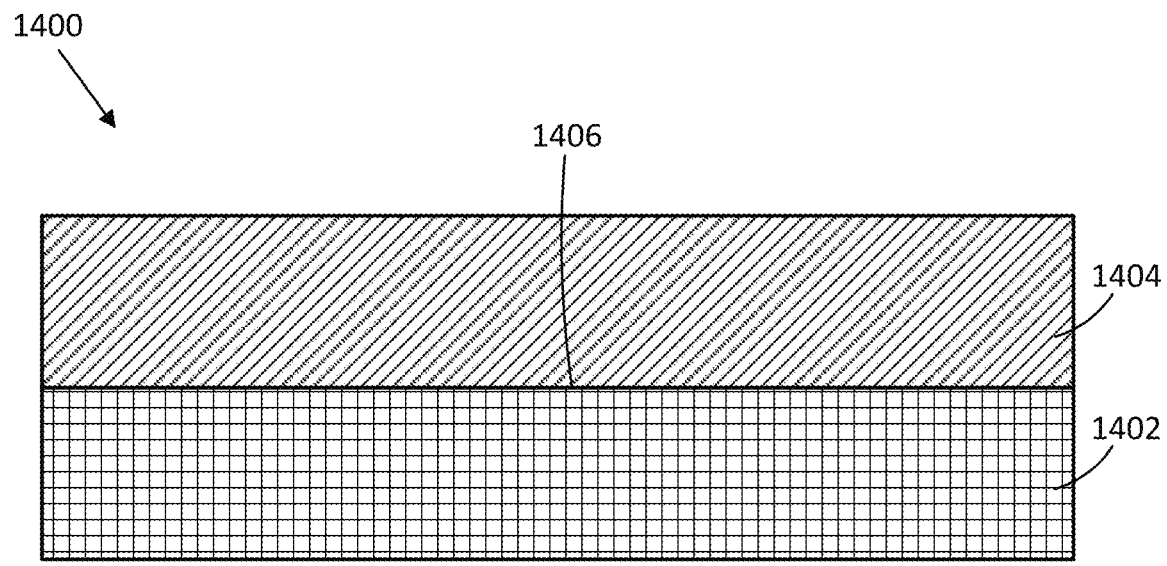
FIG. 14 illustrates an IC structure according to stage 1302 of the procedure of FIG. 13, according to some embodiments of the present disclosure.

The procedure 1300 can begin with a formed first dielectric material, such as the first dielectric material 1402 illustrated in FIG. 14. The first dielectric material may include one or more of the features of the first dielectric material 102 (FIG. 1), including the materials of which the first dielectric material 102 may be comprised. The procedure 1300 initiates with stage 1302. In stage 1302, a second dielectric material is applied to the first dielectric material. The second dielectric material may include one or more of the features of the second dielectric material 104 (FIG. 1), including the materials of which the second dielectric material 104 may be comprised. In particular, the second dielectric material is applied to a top surface of the first dielectric material. The second dielectric material can be applied at approximately a uniform thickness across the top surface of the first dielectric material and can extend for an entirety of the top surface of the first dielectric material. The procedure 1300 may proceed from stage 1302 to stage 1304.

FIG. 14 illustrates an IC structure 1400 according to stage 1302 of the procedure 1300 of FIG. 13, according to some embodiments of the present disclosure. The IC structure 1400 includes a first dielectric material 1402. The IC structure 1400 further includes a second dielectric material 1404 located on the first dielectric material 1402. In particular, the second dielectric material 1404 is located on a top surface 1406 of the first dielectric material 1402. The second dielectric material 1404 extends on the top surface 1406 of the first dielectric material 1402 for an entirety of the top surface 1406, where the second dielectric material 1404 has an approximately uniform thickness for the entirety of the top surface 1406.

In stage 1304, patterning of the second dielectric material is performed. Patterning of the second dielectric material may include removing a portion of the second dielectric material from the top surface of the first dielectric material to produce a certain pattern. In some embodiments, patterning of the second dielectric material may include curing of a portion of the second dielectric material and removing the uncured portion of the second dielectric material or cured portion of the second dielectric material, depending on the chemical makeup of the second dielectric material and the removal procedure being applied. For the disclosed embodiments, the pattern produced by the patterning of the second dielectric material includes at least one recess. The patterned second dielectric material and the first dielectric material may collectively be referred to as a base assembly. The procedure 1300 may proceed from stage 1304 to stage 1306.

Figure 15:
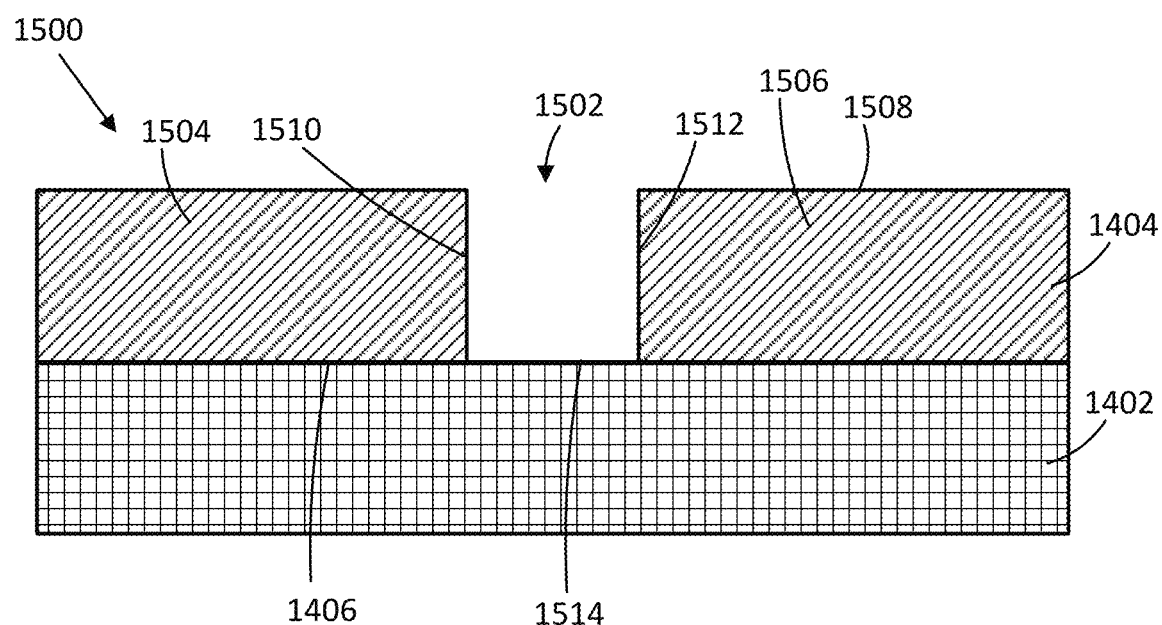
FIG. 15 illustrates an IC structure according to stage 1304 of the procedure of FIG. 13, according to some embodiments of the present disclosure.

FIG. 15 illustrates an IC structure 1500 according to stage 1304 of the procedure 1300 of FIG. 13, according to some embodiments of the present disclosure. In particular, FIG. 15 illustrates the IC structure 1500 produced by stage 1304 being applied to the IC structure 1400 (FIG. 14) in accordance with some embodiments disclosed herein.

The performance of stage 1304 caused a portion of the second dielectric material 1404 to be removed. The removal of the portion of the second dielectric material 1404 produces a recess 1502 within the second dielectric material 1404, where the recess 1502 is located between a first portion 1504 of the second dielectric material 1404 and a second portion 1506 of the second dielectric material 1404. In the illustrated embodiment, the first portion 1504 of the second dielectric material 1404 defines a first sidewall 1510 of the recess 1502 and the second portion 1506 of the second dielectric material 1404 defines a second sidewall 1512 of the recess 1502. While the first sidewall 1510 and the second sidewall 1512 are illustrated as being straight and perpendicular to the top surface 1406 of the first dielectric material 1402 in the illustrated embodiment, it is to be understood that the first sidewall 1510 and/or the second sidewall 1512 can be curved, and/or tapered or reentrant in other embodiments. The recess 1502 extends from a top surface 1508 of the second dielectric material 1404 to the top surface 1406 of the first dielectric material 1402, where the top surface 1508 of the second dielectric material 1404 includes a top surface of the first portion 1504 and the second portion 1506 of the second dielectric material 1404. The top surface 1406 of the first dielectric material 1402 defines a bottom 1514 of the recess 1502. In other embodiments, the recess 1502 may extend partially through the second dielectric material 1404, or through the second dielectric material 1404 and partially through the first dielectric material 1402.

In stage 1306, a first material is formed on the IC structure. The first material may include one or more of the features of the first material 116 (FIG. 1), including the materials of which the first material 116 may be comprised. In particular, the first material is formed on the top surface of the second dielectric material and within the recess at the sidewalls and the bottom of the recess. The first material may be deposited on the top surface of the second dielectric material and within the recess at the sidewalls and the bottom of the recess via a deposition procedure. The first material has a substantially uniform thickness from the surface to which it is applied (i.e., the top surface of the second dielectric material, the sidewalls of the recess, or the bottom of the recess). The procedure 1300 may proceed from stage 1306 to stage 1308.

Figure 16:
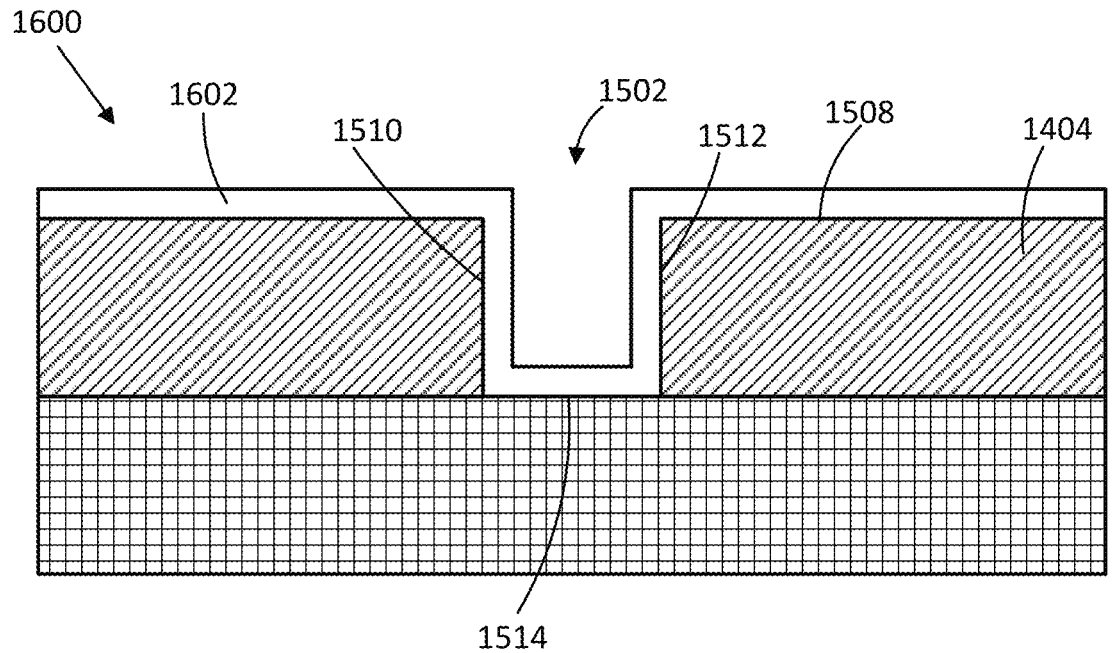
FIG. 16 illustrates an IC structure according to stage 1306 of the procedure of FIG. 13, according to some embodiments of the present disclosure.

FIG. 16 illustrates an IC structure 1600 according to stage 1306 of the procedure 1300 of FIG. 13, according to some embodiments of the present disclosure. In particular, FIG. 16 illustrates the IC structure 1600 produced by stage 1306 being applied to the IC structure 1500 (FIG. 15) in accordance with some embodiments disclosed herein.

The IC structure 1600 includes a first material 1602 that has been formed on the top surface 1508 of the second dielectric material 1404, at the first sidewall 1510 and the second sidewall 1512 within the recess 1502, and at the bottom 1514 of the recess 1502. The first material 1602 abuts the top surface 1508 of the second dielectric material 1404, the first sidewall 1510, the second sidewall 1512, and the bottom 1514 of the recess 1502. The first material 1602 has a substantially uniform thickness from the surfaces on which the first material 1602 has been formed.

In stage 1308, a sacrificial material is to be formed on the first material. In particular, the sacrificial material may be formed on a portion of the first material that is not to be removed in stage 1310. The sacrificial material can be formed on the first material located at the bottom of the recess and can prevent removal of the first material at the bottom of the recess during stage 1310. The sacrificial material may comprise a material that will not be removed by an etch procedure that is performed in stage 1310, but can be removed by another procedure, such as a chemical removal procedure and/or a curing removal procedure. The procedure 1300 may proceed from stage 1308 to stage 1310.

Figure 17:
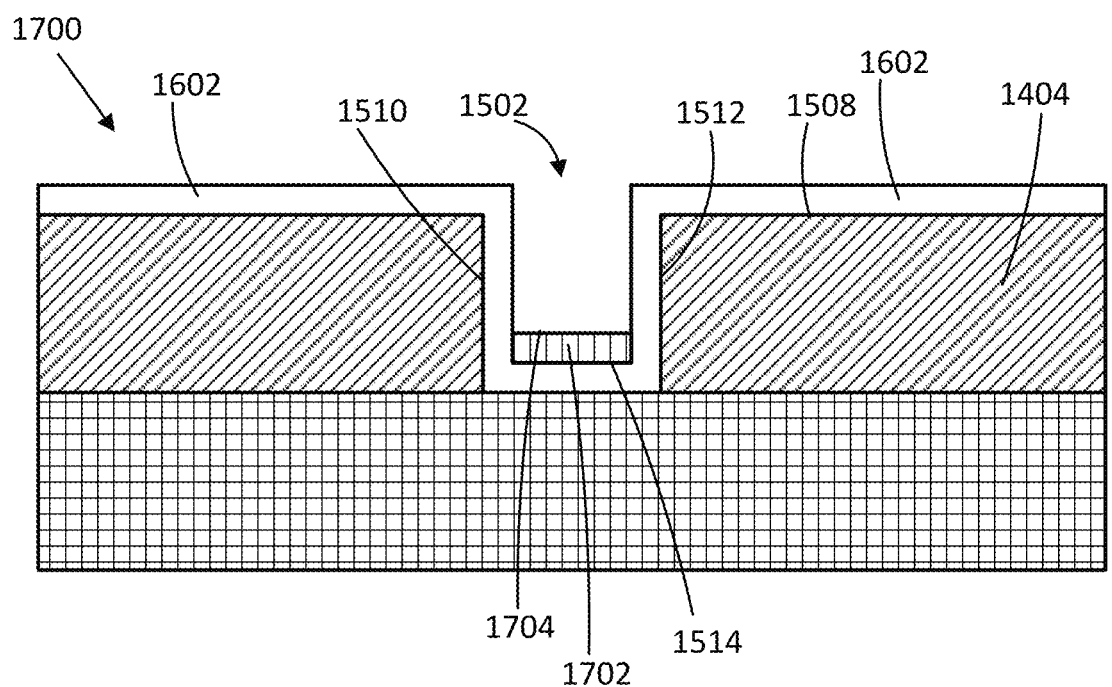
FIG. 17 illustrates an IC structure according to stage 1308 of the procedure of FIG. 13, according to some embodiments of the present disclosure.

FIG. 17 illustrates an IC structure 1700 according to stage 1308 of the procedure 1300 of FIG. 13, according to some embodiments of the present disclosure. In particular, FIG. 17 illustrates the IC structure 1700 produced by stage 1308 being applied to the IC structure 1600 (FIG. 16) in accordance with some embodiments disclosed herein.

The IC structure 1700 includes a sacrificial material 1702 that has been formed on the first material 1602. In particular, the sacrificial material 1702 has been formed within the recess 1502 on top of a portion of the first material 1602 located at the bottom 1514 of the recess 1502. Further, the sacrificial material 1702 extends between the first material 1602 located on the first sidewall 1510 and the first material 1602 located on the second sidewall 1512. A top surface 1704 of the sacrificial material 1702 is located between the top surface 1508 of the second dielectric material 1404 and the first material 1602 located at the bottom 1514 of the recess 1502. Accordingly, a portion of the first material 1602 located on the first sidewall 1510 and a portion of the first material 1602 located on the second sidewall 1512 may remain exposed with the sacrificial material 1702 located on the first material 1602 at the bottom 1514 of the recess 1502. In some embodiments, a majority (i.e., greater than 50%) of the first material 1602 located on the first sidewall 1510 and a majority (i.e., greater than 50%) of the first material located on the second sidewall 1512 remain exposed.

In stage 1310, a portion of the first material on the IC structure is removed. Removal of the first material can include performing an etch procedure on the IC structure, where the etch procedure removes the first material. The etch procedure may include a perpendicular etch procedure (where ions of the etch procedure are directed substantially perpendicularly the bottom of the recess) or an angled etch procedure (where ions of the etch procedure are directed at a non-perpendicular angle to the bottom of the recess). In some embodiments, the ions may be directed at one or more angles within a predetermined distribution of angles, where the distribution can be less than or equal to 90 degrees and greater than or equal to 60 degrees in some embodiments. The etch procedure may remove a portion of the first material formed on the IC structure in stage 1306 that is not protected from removal by the sacrificial material formed in stage 1310. The etch procedure can cause the portion of the first material contacted by ions of the etch procedure to be removed from the IC structure. In some embodiments, the ions may comprise fluorine (F) ions, where the angled etch utilizes an F+-based chemistry. In other embodiments, the ions may comprise ions of other materials utilized for etching procedures, such as chlorine (Cl) ions in a Cl+-based chemistry or bromine (Br) ions in a Br+-based chemistry. In some embodiments, traces of the ions may remain on the IC structure after the etch has been performed. A de-scum or de-ash procedure may be performed on the IC structure to remove the traces of the ions in some embodiments.

Figure 18:
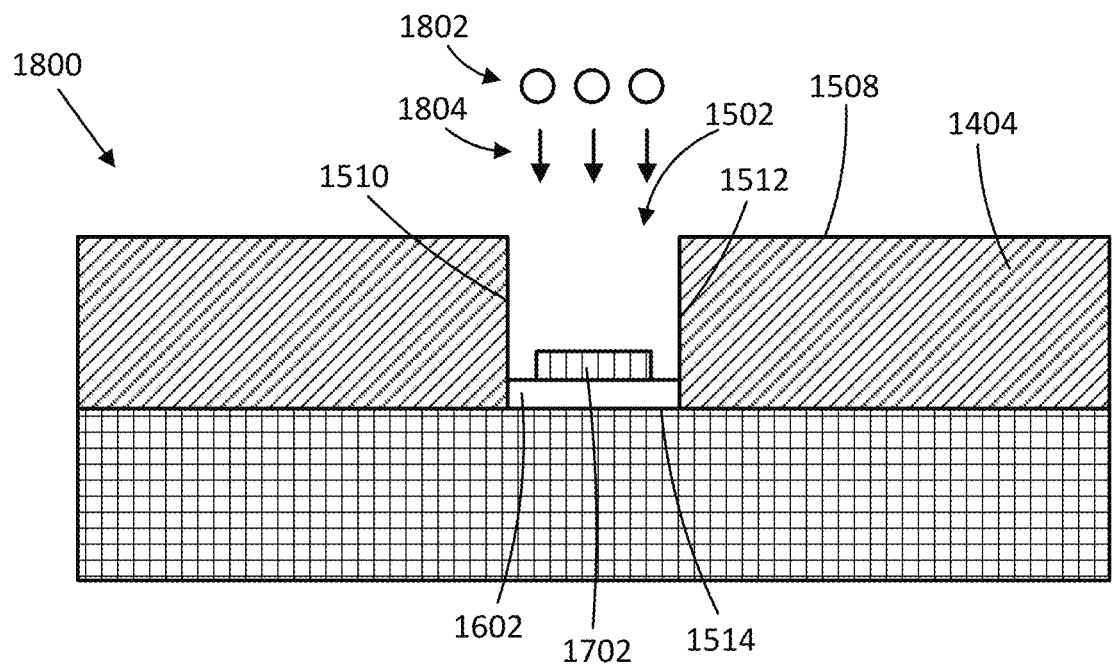
FIG. 18 illustrates an IC structure according to stage 1310 of the procedure of FIG. 13, according to some embodiments of the present disclosure.

FIG. 18 illustrates an IC structure 1800 according to stage 1310 of the procedure 1300 of FIG. 13, according to some embodiments of the present disclosure. In particular, FIG. 18 illustrates the IC structure 1800 produced by stage 1310 being applied to the IC structure 1700 (FIG. 17) in accordance with some embodiments disclosed herein. The procedure 1300 may proceed from stage 1310 to stage 1312.

FIG. 18 illustrates ions 1802 that are directed at the IC structure 1800. Arrows 1804 illustrate directions of travel of the ions 1802. The ions 1802 are directed at the top surface 1508 of the second dielectric material 1404 and are directed perpendicular to the bottom 1514 of the recess 1502. In other embodiments, the ions 1802 may be directed at a non-perpendicular angle (such as an angle that is less than 90 degrees and more than 60 degrees) to the bottom 1514 of the recess 1502. The ions 1802 can contact the first material 1602 not being blocked by the sacrificial material 1702. For example, the ions 1802 can contact the first material 1602 located on the top surface 1508 of the second dielectric material 1404 and the first material 1602 located on the first sidewall 1510 and the second sidewall 1512 (collectively referred to as "the sidewalls"), while being prevented from contacting the first material 1602 located at the bottom 1514 of the recess 1502 by the sacrificial material 1702. In some embodiments, the ions 1802 may further contact a first portion of the first material 1602 located at the bottom 1514 of the recess 1502, while being prevented from contacting a second portion of the first material 1602 located at the bottom 1514 of the recess 1502 by the sacrificial material 1702. The ions 1802 remove the first material 1602 that the ions 1802 contact. In the illustrated embodiment, a thickness of the first material 1602 remaining after the etch procedure is substantially uniform. In other embodiments, portions of the first material 1602 not located directly between the sacrificial material 1702 and the bottom 1514 of the recess 1502 may be thicker than the portion of the first material 1602 located directly between the sacrificial material 1702 and the bottom 1514 of the recess 1502, may be thinner than the portion of the first material 1602 located directly between the sacrificial material 1702 and the bottom 1514 of the recess 1502, or may be completely removed. The first material 1602 may be removed from portions of the first sidewall 1510 and the second sidewall 1512, thereby exposing the portions of the first sidewall 1510 and the second sidewall 1512. In some embodiments, a majority (i.e., greater than 50%) of the first sidewall 1510 is exposed and a majority (i.e., greater than 50%) of the second sidewall 1512 is exposed when the portion of the first material 1602 has been removed.

In stage 1312, the sacrificial material may be removed. In particular, the sacrificial material may be removed from the first material, thereby exposing the first material. For example, the sacrificial material may be removed via a chemical removal procedure and/or a curing removal procedure.

Figure 19:
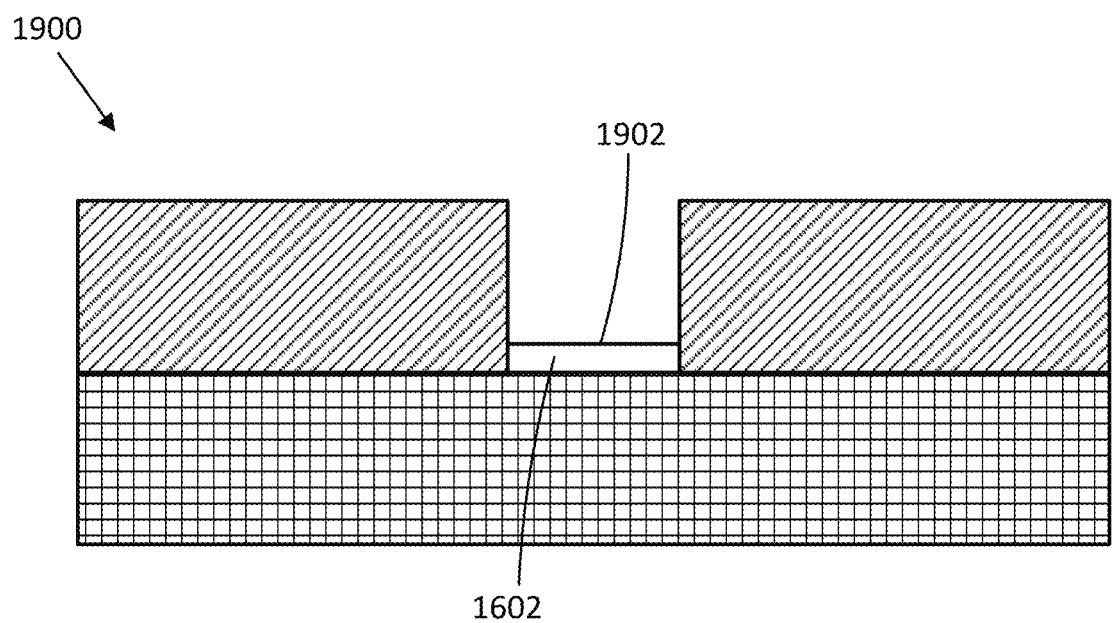
FIG. 19 illustrates an IC structure according to stage 1312 of the procedure of FIG. 13, according to some embodiments of the present disclosure.

FIG. 19 illustrates an IC structure 1900 according to stage 1312 of the procedure 1300 of FIG. 13, according to some embodiments of the present disclosure. In particular, FIG. 19 illustrates the IC structure 1900 produced by stage 1312 being applied to the IC structure 1800 (FIG. 18) in accordance with some embodiments disclosed herein.

The IC structure 1900 is illustrated with the sacrificial material 1702 (FIG. 17) removed. In particular, the sacrificial material 1702 has been removed from the first material 1602. Accordingly, an entirety of a top surface 1902 of the first material 1602 is exposed. The first material 1602 may maintain the shape that the first material 1602 was prior to the removal of the sacrificial material 1702. For example, the first material 1602 may have a substantially uniform thickness in the illustrated embodiment.

From stage 1312, the procedure 1300 may proceed to stage 1314 or stage 1316 depending on the chemical makeup of the first material applied in stage 1306. In particular, the procedure 1300 proceeds to stage 1314 when the first material comprises a SAM material. In other embodiments, the procedure 1300 proceeds to stage 1316 and bypasses stage 1314.

In stage 1314, a third material is formed on the IC structure. The third material may be formed on the IC structure when the first material comprises a SAM material. The third material may comprise a second SAM material that is different from a SAM material of the first material. In some embodiments, the second SAM material may comprise aminosilanes (such as Me2N—SiR3, (Me2N)2SiR2, (Me2N)3SiR, where R is long chain alkyls from C8H17 to C18H37), octadecylphosphonic acid, octadecylthiol, chlorosilane, alkoxysilane (with long alkane chains (such as octadecyl trichlorosilane, trimethoxy(octadecyl)silane) or fluorocarbon (such as triethoxy(3,3,4,4,5,5,6,6,7,7,8,8,9,9,10,10,10-heptadecafluorodecyl, and 1-(3,3,4,4,5,5,6,6,7,7,8,8,9,9,10,10,10-heptadecafluorodecyl)-N,N,N',N',N'',N''-hexamethylsilanetriamine) silane chains, hydrophobic polymer, HfO2, ZrO2, or some combination thereof. The third material is formed within the recess and attaches to the portions of the first dielectric material and/or the second dielectric material from which the first material was removed via the etch. The third material may attach to Si—OH groups produced on the sidewalls of the recess during the etch procedure. Stage 1314 may produce the IC structure 1100 (FIG. 11), where the first dielectric material 1402 (FIG. 14) corresponds to the first dielectric material 302 (FIG. 3), the second dielectric material 1404 (FIG. 14) corresponds to the second dielectric material 304 (FIG. 3), and the first material 1602 (FIG. 16) corresponds to the first material 502 (FIG. 5), and where each of the materials include the features of the corresponding materials of FIG. 11. Further, the third material formed in stage 1314 includes the features of the third material 1102 (FIG. 11) and can be formed on the portions of the sidewalls and/or the bottom 1514 of the recess 1502 from which the first material 1602 was removed in stage 1310.

In stage 1316, a selective growth procedure is performed. The selective growth procedure includes a bottom-up growth of a second material on the first material. The second material can attach to the first material and itself without attaching to the sidewalls of the recess, thereby attaching to the first material and forming outwards from the first material. The second material can grow, through attaching to the first material and itself, to fill the remainder of the recess, where the growth of the second material can prevent seams and/or voids that can occur with other recess fill procedures. The second material can comprise a dielectric material (such as SiOx, SiN, SiC, SiCN, SiOC, SiOCN, and/or metal oxides including ZrO2, HfO2, and AlO2), a metal (such as Ti, TiN, Ta, TaN, Al, Cu, Co, Ru, and/or W), a sacrificial material that can be removed in a subsequent procedure (such as TiO2, TiN, SiOx, SiN, SiC, SiCN, SiOC, SiOCN, Ti, Ta, TaN, Al, Cu, Co, Ru, W, and/or metal oxides including ZrO2, HfO2, and AlO2), or some combination thereof.

Figure 20:
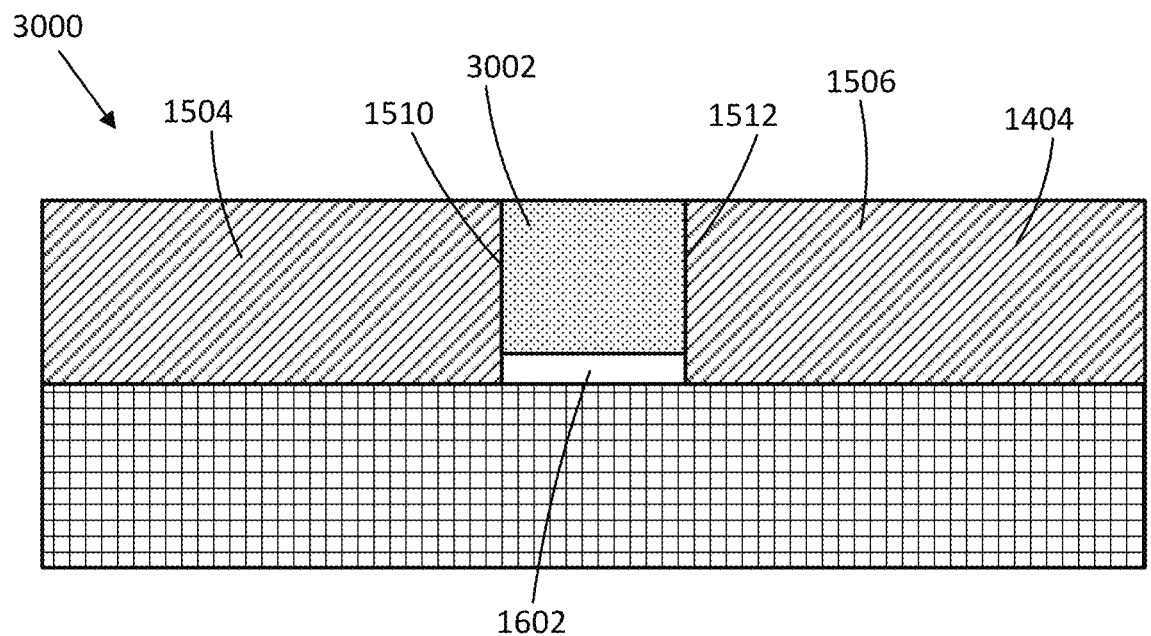
FIG. 20 illustrates an IC structure according to stage 1316 of the procedure of FIG. 13, according to some embodiments of the present disclosure.

FIG. 20 illustrates an IC structure 3000 according to stage 1316 of the procedure 1300 of FIG. 13, according to some embodiments of the present disclosure. In particular, FIG. 20 illustrates a result of performing stage 1316 on the IC structure 1900 (FIG. 19) in some embodiments.

The IC structure 3000 includes a second material 3002 located within the recess 1502 (FIG. 15). The second material 3002 is located on the first material 1602 and abuts the first material 1602. The second material 3002 may have been grown on the first material 1602 while not growing on the second dielectric material 1404. The second material 3002 further is located between the first portion 1504 of the second dielectric material 1404 and the second portion 1506 of the second dielectric material 1404. The second material 3002 further abuts the first portion 1504 and the second portion 1506. In particular, the second material 3002 is in contact with the first sidewall 1510 defined by the first portion 1504 of the second dielectric material 1404 and is in contact with the second sidewall 1512 defined by the second portion 1506 of the second dielectric material 1404. The second material 3002 can fill the remainder of the recess 1502, such that the first material 1602 and the second material 3002 collectively fill the recess 1502.

It should be understood that stage 1316 can be applied to the IC structure 1100 (FIG. 11), produced via stage 1314, in other embodiments. In particular, the selective growth procedure can produce the second material within the recess of the IC structure. Applying stage 1316 to the IC structure 1100 can result in the IC structure 1200 (FIG. 12), where the second material formed via stage 1316 corresponds to the second material 1202 (FIG. 12), and the materials of the IC structure produced by stage 1316 include the features of the corresponding materials of the IC structure 1200.

In stage 1318, the second material is removed. In particular, stage 1318 can be performed when the second material is a sacrificial material. In some embodiments, the first material and/or the third material may be removed with the second material in stage 1318. Further procedures may be performed after stage 1318 to fill the recess and/or cover the recess after the second material, the first material, and/or the third material have been removed.

Figure 21:
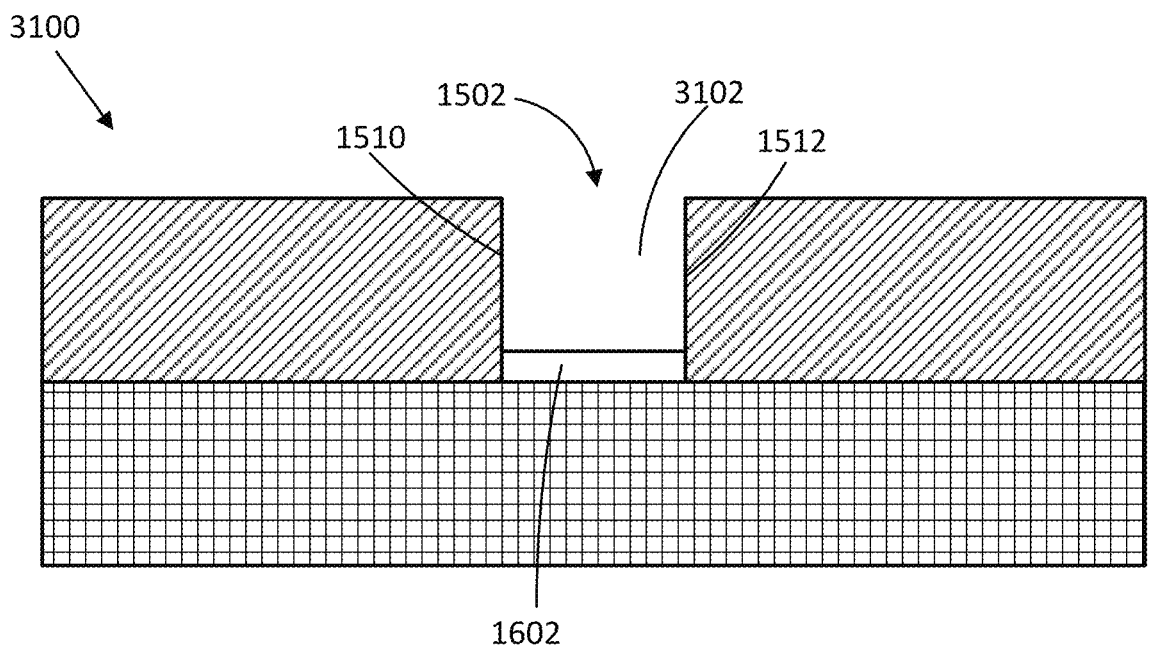
FIG. 21 illustrates an IC structure according to stage 1318 of the procedure of FIG. 13, according to some embodiments of the present disclosure.

FIG. 21 illustrates an IC structure 3100 according to stage 1318 of the procedure 1300 of FIG. 13, according to some embodiments of the present disclosure. In particular, FIG. 21 illustrates a result of performing stage 1318 on the IC structure 3000 (FIG. 20). In particular, the second material 3002 (FIG. 20) has been removed in the illustrated embodiment of the IC structure 3100. It should be understood that stage 1318 may be performed on the IC structure 1200 (FIG. 12) produced by stage 1316, where the second material, the third material, and the first material 502 may be removed from the IC structure 1200.

In the IC structure 3100 illustrated, the second material 3002 had been removed. A void 3102 (i.e., lack of material) exists in the recess 1502 where the second material 3002 had been removed. The removal of the second material 3002 exposes the first material 1602, the first sidewall 1510, and the second sidewall 1512. The void 3102 may be filled or covered via further procedures performed on the IC structure 3100. In other embodiments, the first material 1602, or some portion of, may be removed with the second material 3002, where the void 3102 includes the area in the recess 1502 where the second material 3002 and the first material 1602 were removed.

While the figures illustrated to describe the procedure 1300 are illustrated utilizing the IC structure 1900 (FIG. 19) with the first material 1602 being a uniform thickness, it is to be understood that the procedure 1300 can produce IC structures with first material that varies in thickness. For example, the thickness of a portion of the first material near the sidewalls of the recess may be thicker or thinner than another portion of the first material near the center of the recess in other embodiments. Further, while the recess 1502 (FIG. 5) has vertical sidewalls in the illustrated embodiment, it is to be understood that the recess 1502 can be different shapes in other embodiments. For example, the recess 1502 may have tapered sidewalls, as illustrated in FIG. 22, or reentrant sidewalls, as illustrated in FIG. 23, in other embodiments.

FIG. 22 illustrates another IC structure 3200, according to some embodiments of the present disclosure. In particular, the IC structure 3200 includes tapered sidewalls. Further, it is to be understood that the procedure 200 (FIG. 2) and/or the procedure 1300 (FIG. 13) can produce IC structures with tapered sidewalls. The IC structure 3200 may undergo further processing in IC die production where additional materials can be affixed on the top and/or bottom of the IC structure 3200. A further IC component may be coupled to the IC die with the IC structure 3200 in some embodiments.

The IC structure 3200 may include one or more of the features of the IC structure 100 (FIG. 1). In particular, the IC structure 3200 includes a first dielectric material 3202 that includes one or more features of the first dielectric material 102 (FIG. 1), a second dielectric material 3204 that includes one or more of the features of the second dielectric material 104 (FIG. 1), a first material 3206 that includes one or more features of the first material 116 (FIG. 1), and a second material 3208 that includes one or more of the features of the second dielectric material 104 (FIG. 1). The IC structure 3200 includes a recess 3210 located on the first dielectric material 3202 and between a first portion 3212 and a second portion 3214 of the second dielectric material 3204, where the recess 3210 is filled by the first material 3206 and the second material 3208, the second material 3208 being located on the first material 3206. The recess 3210 is narrower at a top surface 3216 of the first dielectric material 3202 than at a top surface 3218 of the second dielectric material 3204. Accordingly, a first sidewall 3220 of the recess 3210 and a second sidewall 3222 are both tapered from the top surface 3218 of the second dielectric material 3204 to the top surface 3216 of the first dielectric material 3202. It is to be understood that any of the IC structures disclosed herein may have tapered sidewalls, such as the first sidewall 3220 and the second sidewall 3222.

FIG. 23 illustrates another IC structure 3300, according to some embodiments of the present disclosure. In particular, the IC structure 3300 includes reentrant sidewalls. Further, it is to be understood that the procedure 200 (FIG. 2) and/or the procedure 1300 (FIG. 13) can produce IC structures with reentrant sidewalls. The IC structure 3300 may undergo further processing in IC die production where additional materials can be affixed on the top and/or bottom of the IC structure 3300. A further IC component may be coupled to the IC die with the IC structure 3300 in some embodiments.

The IC structure 3300 may include one or more of the features of the IC structure 100 (FIG. 1). In particular, the IC structure 3300 includes a first dielectric material 3302 that includes one or more features of the first dielectric material 102 (FIG. 1), a second dielectric material 3304 that includes one or more of the features of the second dielectric material 104 (FIG. 1), a first material 3306 that includes one or more features of the first material 116 (FIG. 1), and a second material 3308 that includes one or more of the features of the second dielectric material 104 (FIG. 1). The IC structure 3300 includes a recess 3310 located on the first dielectric material 3302 and between a first portion 3312 and a second portion 3314 of the second dielectric material 3304, where the recess 3310 is filled by the first material 3306 and the second material 3308, the second material 3308 being located on the first material 3306. The recess 3310 is wider at a top surface 3316 of the first dielectric material 3302 than at a top surface 3318 of the second dielectric material 3304. Accordingly, a first sidewall 3320 of the recess 3310 and a second sidewall 3322 are both reentrant from the top surface 3318 of the second dielectric material 3304 to the top surface 3316 of the first dielectric material 3302. It is to be understood that any of the IC structures disclosed herein may have reentrant sidewalls, such as the first sidewall 3320 and the second sidewall 3322.

Example Structures and Devices

IC structures that include one or more recesses processed via selective growth as disclosed herein may be included in any suitable electronic device. FIGS. 24-28 illustrate various examples of devices and components that may include one or more recesses processed via selective grows as disclosed herein.

Figure 24B:
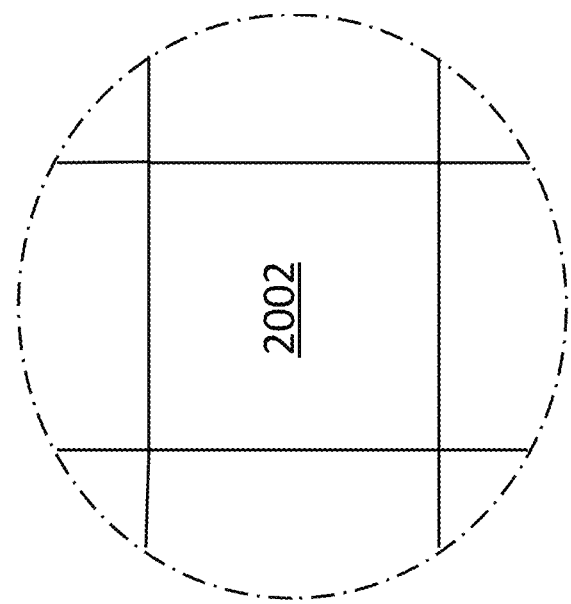
FIG. 24B is a top view of dies that may include one or more IC structures having recesses processed via selective growth in accordance with any of the embodiments disclosed herein.
Figure 24A:
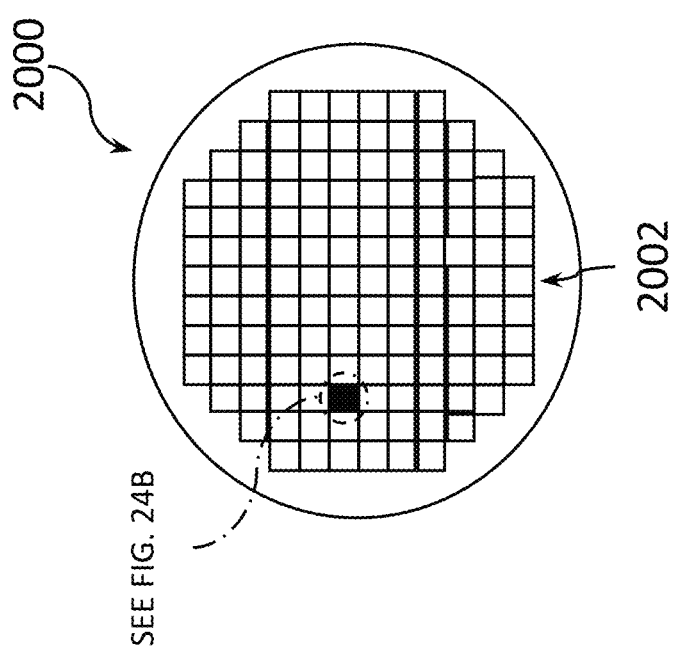
FIG. 24A is top view of a wafer that may include one or more IC structures having recesses processed via selective growth in accordance with any of the embodiments disclosed herein.

FIGS. 24A-24B are top views of a wafer 2000 and dies 2002 that may include one or more IC structures having recesses processed via selective growth in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 25. The wafer 2000 may be composed of semiconductor material and may include one or more dies 2002 having IC structures formed on a surface of the wafer 2000. Each of the dies 2002 may be a repeating unit of a semiconductor product that includes any suitable IC. After the fabrication of the semiconductor product is complete (e.g., after manufacture of any embodiment of the IC structure 100 described herein), the wafer 2000 may undergo a singulation process in which each of the dies 2002 is separated from one another to provide discrete "chips" of the semiconductor product. In particular, devices that include one or more IC structures as disclosed herein may take the form of the wafer 2000 (e.g., not singulated) or the form of the die 2002 (e.g., singulated). The die 2002 may include one or more IC structures having recesses processed via selective growth, as well as, optionally, supporting circuitry to route electrical signals via the IC structures, as well as to any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 25:
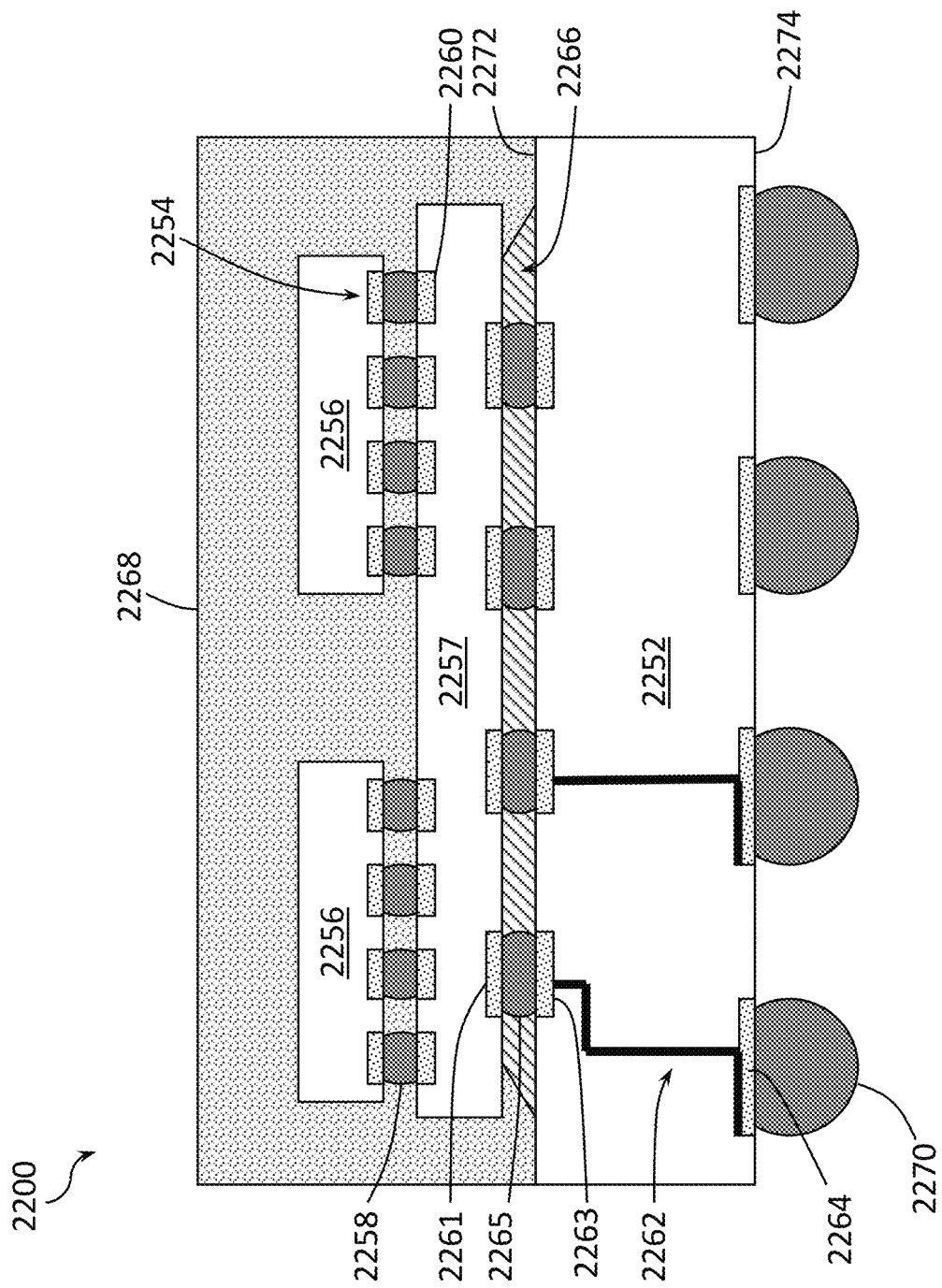
FIG. 25 is a side, cross-sectional view of an example IC package that may include one or more IC structures having one or more recesses processed via selective growth in accordance with any of the embodiments disclosed herein.

FIG. 25 is a side, cross-sectional view of an example IC package 2200 that may include one or more IC structures having one or more recesses processed via selective growth in accordance with any of the embodiments disclosed herein. In some embodiments, the IC package 2200 may be a system-in-package (SiP).

As shown in FIG. 25, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 25 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 25 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 25 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 26.

The dies 2256 may take the form of any of the embodiments of the die 2002 discussed herein and may include any of the embodiments of an IC structure having one or more recesses processed via selective growth, e.g., any of the IC structures, described herein. In embodiments in which the IC package 2200 includes multiple dies 2256, the IC package 2200 may be referred to as an MCP. The dies 2256 may include circuitry to perform any desired functionality. For example, one or more of the dies 2256 may be RF FE dies, including one or more recesses processed via selective growth as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more recesses processed via selective growth, e.g., as discussed above; in some embodiments, at least some of the dies 2256 may not include any recesses processed via selective growth.

The IC package 2200 illustrated in FIG. 25 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 25, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 26:
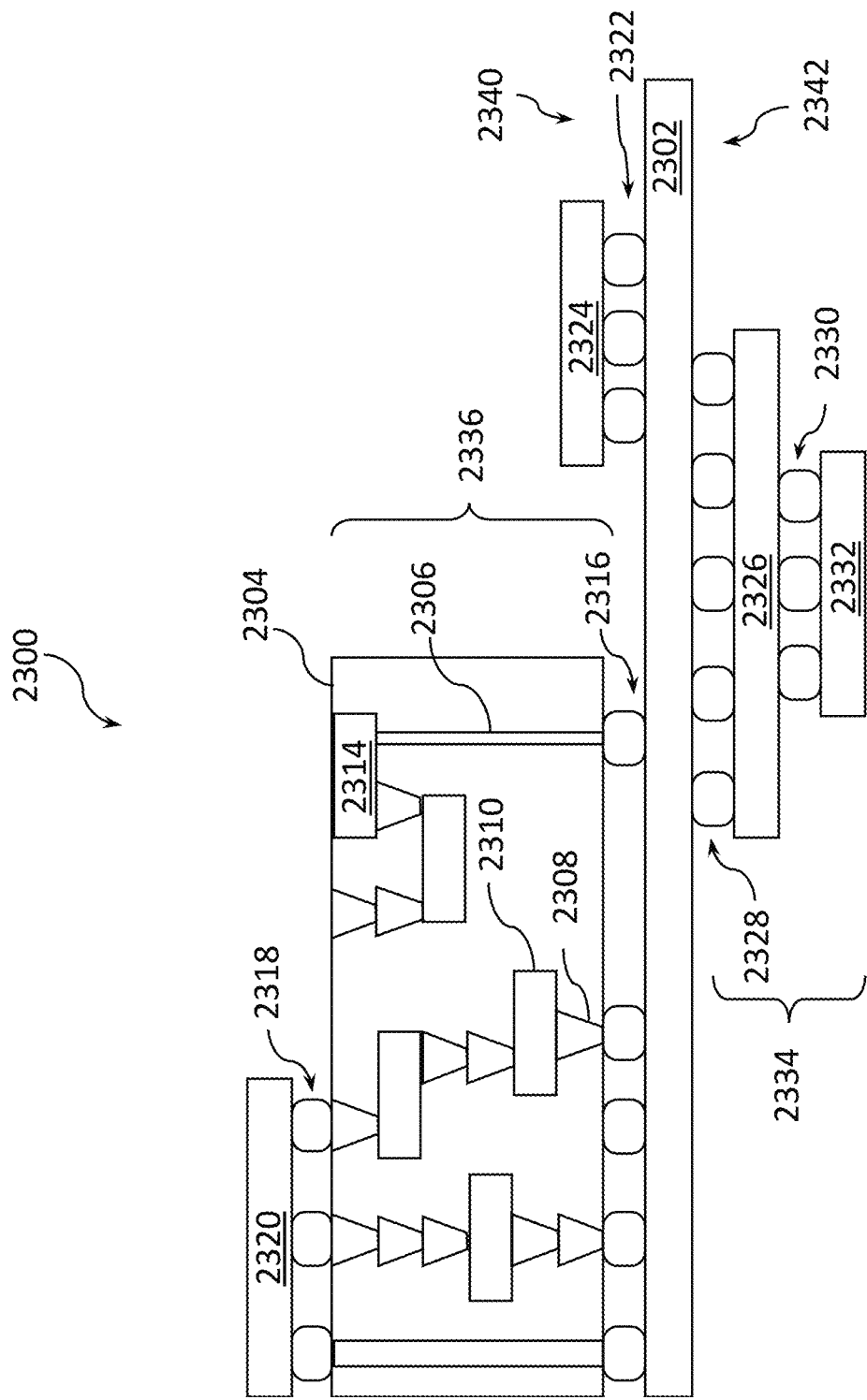
FIG. 26 is a cross-sectional side view of an IC device assembly that may include components having one or more IC structures implementing one or more recesses processed via selective growth in accordance with any of the embodiments disclosed herein.

FIG. 26 is a cross-sectional side view of an IC device assembly 2300 that may include components having one or more IC structures implementing one or more recesses processed via selective growth in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more recesses processed via selective growth in accordance with any of the embodiments disclosed herein; e.g., any of the IC packages discussed below with reference to the IC device assembly 2300 may take the form of any of the embodiments of the IC package 2200 discussed above with reference to FIG. 25.

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 26 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 26), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 24B), an IC device (e.g., the IC structure of FIGS. 1, 3-12, and 14-23), or any other suitable component. In particular, the IC package 2320 may include one or more recesses processed via selective growth as described herein. Although a single IC package 2320 is shown in FIG. 26, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 26, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include materials for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing one or more recesses processed via selective growth as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 26 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 27:
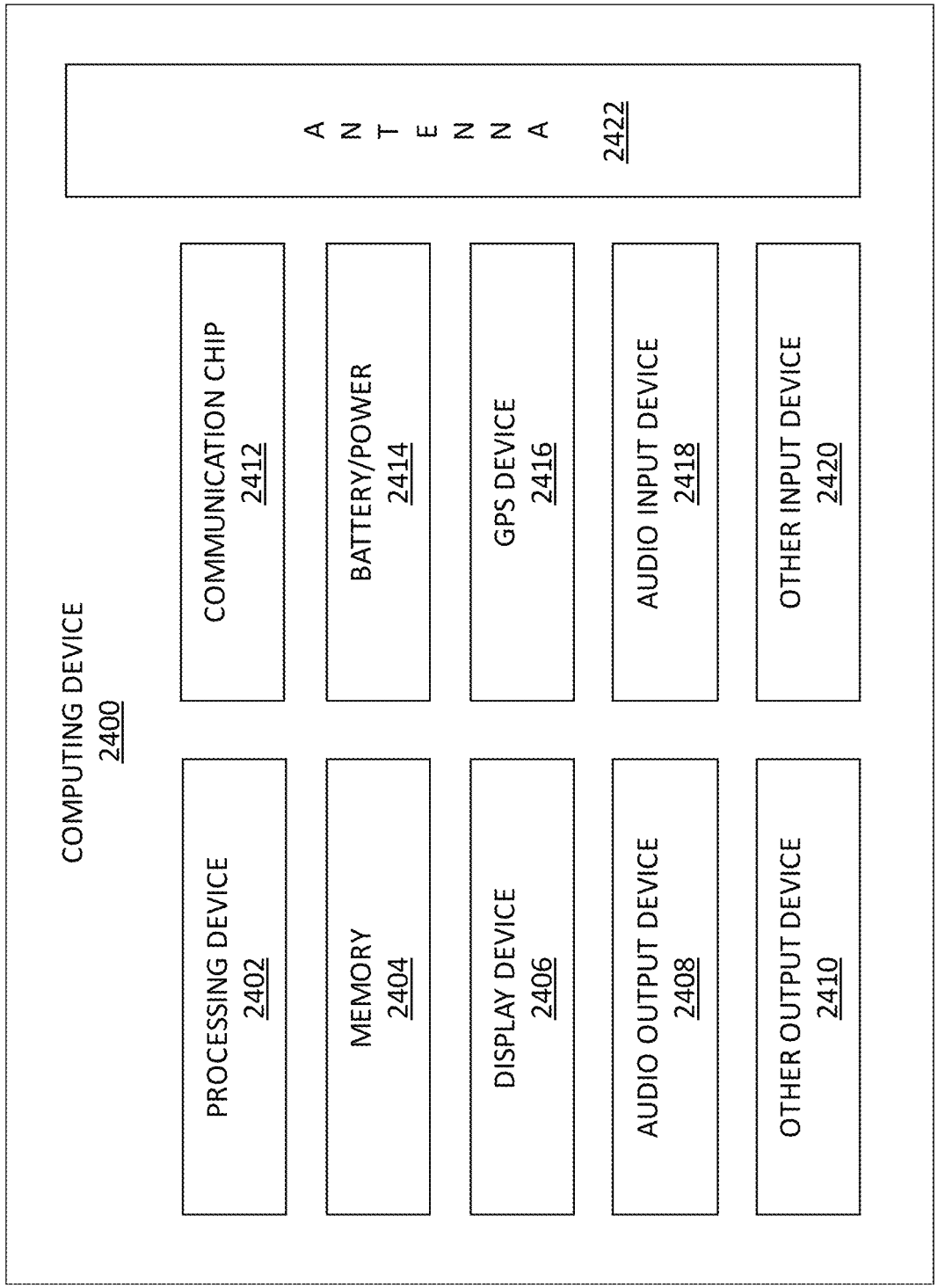
FIG. 27 is a block diagram of an example computing device that may include one or more components with one or more IC structures having one or more recesses processed via selective growth in accordance with any of the embodiments disclosed herein.

FIG. 27 is a block diagram of an example computing device 2400 that may include one or more components with one or more IC structures having one or more recesses processed via selective growth in accordance with any of the embodiments disclosed herein. For example, any suitable ones of the components of the computing device 2400 may include a die (e.g., the die 2002 (FIG. 24B)) including one or more recesses processed via selective growth in accordance with any of the embodiments disclosed herein. Any of the components of the computing device 2400 may include an IC device (e.g., any embodiment of the IC structures of FIGS. 1, 3-12, and 14-23) and/or an IC package 2200 (FIG. 25). Any of the components of the computing device 2400 may include an IC device assembly 2300 (FIG. 26).

A number of components are illustrated in FIG. 27 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 27, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures including one or more recesses processed via selective growth as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 includes an integrated circuit (IC) structure, comprising a first dielectric material, a second dielectric material on the first dielectric material, a recess in the second dielectric material, wherein the recess includes a bottom, a top, and sidewalls, a first material within the recess and at a bottom of the recess, wherein the first material includes a metal and oxygen, a self-assembled monolayer (SAM) material, or an organic material, and a second material within the recess and between the first material and the top of the recess, wherein the second material is in contact with the sidewalls of the recess.

Example 2 includes the IC structure of example 1, wherein a top edge of the second material is aligned with the top of the recess.

Example 3 includes the IC structure of example 1, wherein the first material is in contact with a first portion of the sidewalls of the recess, and wherein the second material is in contact with a second portion of the sidewalls of the recess.

Example 4 includes the IC structure of example 1, wherein the second material is in contact with an entirety of the sidewalls of the recess.

Example 5 includes the IC structure of example 1, wherein the second material comprises a dielectric material or a metal.

Example 6 includes the IC structure of example 1, further comprising a third material on both sides of the recess, wherein the third material is between the second dielectric material and the recess, and wherein the third material defines the sidewalls of the recess.

Example 7 includes the IC structure of example 1, wherein the bottom of the recess abuts the first dielectric material, and wherein the first material is on the first dielectric material.

Example 8 includes the IC structure of example 1, wherein the first material comprises silicon and oxide.

Example 9 includes an integrated circuit (IC) package, comprising an IC die, including a first dielectric material, a second dielectric material on the first dielectric material, wherein a recess is between a first portion of the second dielectric material and a second portion of the second dielectric material, and wherein a sidewall of the first portion of the second dielectric material abuts the recess and a sidewall of the second portion of the second dielectric material abuts the recess, and a material on the first dielectric material and within the recess, the material comprising a metal and oxygen, a self-assembled monolayer (SAM) material, or an organic material, wherein less than an entirety of the sidewall of the first portion of the second dielectric material abuts the material and less than an entirety of the sidewall of the second portion of the second dielectric material abuts the material, and a further IC component coupled to the IC die.

Example 10 includes the IC package of example 9, wherein a height of the material is less than a height of the recess.

Example 11 includes the IC package of example 9, wherein the material is a first material, wherein the IC die further includes a second material on the first material and within the recess, and wherein the second material and the first material fill the recess.

Example 12 includes the IC package of example 11, wherein the second material abuts a portion of the sidewall of the first portion of the second dielectric material and a portion of the sidewall of the second portion of the second dielectric material.

Example 13 includes the IC package of example 12, wherein the portion of the sidewall of the first portion of the second dielectric material is a first portion of the sidewall of the first portion of the second dielectric material, wherein the portion of the sidewall of the second portion of the second dielectric material is a first portion of the sidewall of the second portion of the second dielectric material, and wherein the first material abuts a second portion of the sidewall of the first portion of the second dielectric material and a second portion of the sidewall of the second portion of the second dielectric material.

Example 14 includes the IC package of example 9, wherein the material is a first material, and wherein the IC die further includes a second material on the first material and within the recess, and a third material, a first portion of the third material between the second material and the first portion of the second dielectric material and a second portion of the third material between the second material and the second portion of the second dielectric material.

Example 15 includes the IC package of example 14, wherein the SAM material is a first SAM material, wherein the first material comprises the first SAM material or an organic material, and wherein the third material comprises a second SAM material, the second SAM material being different from the first SAM material.

Example 16 includes the IC package of example 14, wherein the first material, the second material, and the third material fill the recess.

Example 17 includes a method of producing an integrated circuit (IC) structure, comprising forming a first material on a base assembly, the base assembly having a recess and the first material being applied to sidewalls and a bottom of the recess, performing an angled etch of the first material to remove the first material from a portion of the sidewalls of the recess while leaving the first material in place at the bottom of the recess, and forming a second material on the first material.

Example 18 includes the method of example 17, wherein performing the angled etch includes directing ions at an angle of between 60 degrees and 85 degrees to the bottom of the recess at the first material, the ions to remove the first material from the portion of the sidewalls of the recess.

Example 19 includes the method of example 17, wherein the base assembly comprises one or more dielectric materials, and wherein the first material comprises a metal and oxygen, a self-assembled monolayer (SAM) material, or an organic material.

Example 20 includes the method of example 19, wherein the SAM material is a first SAM material or an organic material, and wherein the method further comprises forming a third material on the portion of the sidewalls, the third material comprising a second SAM material.

Example 21 includes an integrated circuit (IC) structure, comprising a first dielectric material region, a second dielectric material region located on the first dielectric material region, a top edge of the second dielectric material region being opposite from the first dielectric material region, and a material region located on the first dielectric material region and between a first portion of the second dielectric material region and a second portion of the second dielectric material region, a top edge of the material region being located between the first dielectric material region and the top edge of the second dielectric material region, and the material region comprising a metal and oxygen, a self-assembled monolayer (SAM) material, or an organic material.

Example 22 includes the IC structure of example 21, further comprising a growth region located on the growth base region, the growth base region being located between the base structure and the growth region, wherein a top edge of the growth region is aligned with the top edge of the pattern region.

Example 23 includes the IC structure of example 22, wherein the growth region abuts a sidewall of the first portion of the pattern region and a sidewall of the second portion of the pattern region.

Example 24 includes the IC structure of example 22, wherein the growth region comprises a dielectric material or a metal.

Example 25 includes the IC structure of example 22, further comprising a protective region, a first portion of the protective region located between the first portion of the pattern region and the growth region and a second portion of the protective region located between the second portion of the pattern region, wherein the protective region and the growth base region separate the growth region from the base structure and the pattern region.

Example 26 includes the IC structure of example 25, wherein the growth base region comprises a SAM material or an organic material.

Example 27 includes the IC structure of example 21, wherein the growth base region includes silicon and oxide.

Example 28 includes the IC structure of example 21, wherein the base structure comprises a first dielectric material and the pattern region comprises a second dielectric material.

Example 29 includes an integrated circuit (IC) package, comprising an IC die, including a base structure, a pattern region located on the base structure, wherein a recess is located between a first portion of the pattern region and a second portion of the pattern region, and wherein a sidewall of the first portion of the pattern region abuts the recess and a sidewall of the second portion of the pattern region abuts the recess, and a growth base region located on the base structure and within the recess, the growth base region comprising a metal and oxygen, a self-assembled monolayer (SAM) material, or an organic material, wherein less than an entirety of the sidewall of the first portion of the pattern region abuts the growth base region and less than an entirety of the sidewall of the second portion of the pattern region abuts the growth base region, and a further IC component coupled to the IC die.

Example 30 includes the IC package of example 29, wherein the IC die further includes a growth region located on the growth base region and within the recess, wherein the growth region and the growth base region fill the recess.

Example 31 includes the IC package of example 30, wherein the growth region abuts a portion of the sidewall of the first portion of the pattern region and a portion of the sidewall of the second portion of the pattern region.

Example 32 includes the IC package of example 31, wherein the portion of the sidewall of the first portion of the pattern region is a first portion of the sidewall of the first portion of the pattern region, wherein the portion of the sidewall of the second portion of the pattern region is a first portion of the sidewall of the second portion of the pattern region, and wherein the growth base region abuts a second portion of the sidewall of the first portion of the pattern region and a second portion of the sidewall of the second portion of the pattern region.

Example 33 includes the IC package of example 29, wherein the IC die further includes a growth region located on the growth base region and within the recess, and a protective region, a first portion of the protective region located between the growth region and the first portion of the pattern region and a second portion of the protective region located between the growth region and the second portion of the pattern region.

Example 34 includes the IC package of example 33, wherein the SAM material is a first SAM material, wherein the growth base region comprises the first SAM material or an organic material, and wherein the protective region comprises a second SAM material, the second SAM material being different from the first SAM material.

Example 35 includes the IC package of example 33, wherein the growth base region, the growth region, and the protective region fill the recess.

Example 36 includes a method of producing an integrated circuit (IC) structure, comprising applying a growth base material to a base assembly, the base assembly having a recess and the growth base material being applied to sidewalls and a bottom of the recess, directing etching ions at the growth base material to remove a portion of the growth base material, the etching ions directed at an angle of less than 90 degrees to a top surface of the growth base material, wherein the etching ions remove the growth base material from a portion of the sidewalls and the growth base material remaining on the base assembly forms a growth base region, and growing a growth region on the growth base region.

Example 37 includes the method of example 36, wherein the etching ions are directed at an angle of between 60 degrees and 85 degrees to the bottom of the recess.

Example 38 includes the method of example 36, wherein the base assembly comprises one or more dielectric materials, and wherein the growth base material comprises a metal and oxygen, a self-assembled monolayer (SAM) material, or an organic material.

Example 39 includes the method of example 38, wherein the SAM material is a first SAM material or an organic material, and wherein the method further comprises forming a protective region on the portion of the sidewalls, the protection region comprising a second SAM material.

Example 40 includes a method of producing an integrated circuit (IC) structure, comprising forming a first material on a base assembly, the base assembly having a recess and the first material being applied to sidewalls and a bottom of the recess, forming a sacrificial material on the first material and within the recess, wherein the first material is between the sacrificial material and the bottom of the recess, performing an etch of the first material to remove the first material from a portion of the sidewalls of the recess, wherein the sacrificial material prevents removal of the first material from a portion of the bottom of the recess, removing the sacrificial material from the first material, and forming a second material on the first material.

Example 41 includes the method of example 40, wherein performing the etch includes directing ions perpendicularly to the bottom of the recess at the first materials, the ions to remove the first material from the portion of the sidewalls of the recess and the sacrificial material prevents contact of the ions with the first material on the portion of the bottom of the recess.

Example 42 includes the method of example 40, wherein the base assembly comprises one or more dielectric materials, and wherein the first material comprises a metal and oxygen, a self-assembled monolayer (SAM) material, or an organic material.

Example 43 includes the method of example 40, wherein forming the second material includes filling the recess with the second material.

Example 44 provides an IC package that includes an IC die, the IC die including the IC structure according to any one of the preceding examples (e.g., any one of examples 1-43), and a further IC component, coupled to the IC die.

Example 45 provides the IC package according to example 44, where the IC die includes the IC structure according to any one of the preceding examples, e.g., the IC structure according to any one of examples 1-43.

Example 46 provides the IC package according to any one of examples 44-45, where the further IC component includes one of a package substrate, an interposer, or a further IC die.

Example 47 provides an electronic device that includes a carrier substrate; and an IC die coupled to the carrier substrate, where the IC die includes the IC structure according to any one of examples 1-43, and/or is included in the IC package according to any one of examples 45-46.

Example 48 provides the electronic device according to example 47, where the electronic device is a wearable or handheld electronic device.

Example 49 provides the electronic device according to examples 47 or 48, where the electronic device further includes one or more communication chips and an antenna.

Example 50 provides the electronic device according to any one of examples 47-49, where the carrier substrate is a motherboard.

Example 51 provides the electronic device according to any one of examples 47-50, where the electronic device is an RF transceiver, an RF receiver, or an RF transmitter.

Example 52 provides the electronic device according to any one of examples 47-50, where the electronic device is one of a switch, a power amplifier, a low-noise amplifier, a filter, a filter bank, a duplexer, an upconverter, or a downconverter of an RF communications device, e.g., of one of an RF transceiver, an RF receiver, or an RF transmitter.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising: a first dielectric material; a second dielectric material on the first dielectric material; a recess in the second dielectric material, wherein the recess includes a bottom, a top, a first sidewall, and a second sidewall, the bottom extending across a width of a recess from the first sidewall to the second sidewall, wherein a top surface of the first dielectric material defines the bottom of the recess, the second dielectric material extends along the heights of the first sidewall and the second sidewall, and the bottom of the recess is aligned with a bottom surface of the second dielectric material; a first material within the recess and at the bottom of the recess, wherein the first material includes a metal and oxygen, a self-assembled monolayer (SAM) material, or an organic material, and wherein the first material is directly on the first dielectric material; a second material within the recess and between the first material and the top of the recess, wherein a base of the second material is in direct contact with the first material; and a third material within the recess, the third material different from the first material and different from the second material, wherein the third material is within: a first region along the first sidewall of the recess and in contact with an upper surface of the first material within the recess; and a second region along the second sidewall of the recess and in contact with the upper surface of the first material within the recess, wherein the second material is in contact with the first region and the second region, wherein the third material along the first and second sidewalls of the recess is in direct contact with the second material, the first and second sidewalls of the recess, and the upper surface of the first material within the recess.

2. The IC structure of claim 1, wherein a top edge of the second material is aligned with the top of the recess.

3. The IC structure of claim 1, wherein the second material comprises a dielectric material or a metal.

4. The IC structure of claim 1, wherein the bottom of the recess abuts the first dielectric material, and wherein the first material is on the first dielectric material.

5. The IC structure of claim 1, wherein the first material comprises silicon and oxide.

6. The IC structure of claim 1, wherein the first material has an upper surface, a lower surface, and a side extending between the upper surface and the lower surface, the side at an acute angle relative to the lower surface.

7. The IC structure of claim 1, wherein the first material has a first thickness proximate to the first sidewall and a second thickness at a midpoint between the first sidewall and the second sidewall, the first thickness greater than the second thickness.

8. The IC structure of claim 1, wherein the first material includes the SAM material.

9. The IC structure of claim 1, wherein the first material includes the organic material.

10. The IC structure of claim 1, wherein the bottom of the recess is aligned with the top surface of the first dielectric material.

11. The IC structure of claim 1, wherein the first material within the recess is under the first region comprising the third material and under the second region comprising the third material.

12. The IC structure of claim 1, wherein the second region comprising the third material is in contact with a first portion of the second sidewall of the recess, and wherein the second material is in contact with a second portion of the second sidewall of the recess.

13. The IC structure of claim 1, wherein, a width of the first material within the recess is greater than a width of the second material within the recess.

14. The IC structure of claim 1, wherein a seam is not present in a cross-section through the second material.

15. The IC structure of claim 1, wherein, during a deposition process, the second material grows over the first material, and the second material does not attach to the third material.

16. An integrated circuit (IC) package, comprising: an IC die, including: a first dielectric material; a second dielectric material on the first dielectric material, wherein a recess is between a first portion of the second dielectric material and a second portion of the second dielectric material, wherein a top surface of the first dielectric material defines a bottom of the recess, the bottom of the recess is aligned with a bottom surface of the second dielectric material, a first sidewall of the first portion of the second dielectric material abuts and extends up a height of the recess, and a second sidewall of the second portion of the second dielectric material abuts and extends up a height of the recess, wherein the bottom extends across a width of the recess from the first sidewall to the second sidewall; a first material directly on the first dielectric material and within the recess, the first material comprising a metal and oxygen, a self-assembled monolayer (SAM) material, or an organic material; a second material within the recess and between the first material and a top of the recess, wherein a base of the second material is in direct contact with the first material; and a third material within the recess, the third material different from the first material and different from the second material, wherein the third material is within: a first region along the first sidewall of the recess and in contact with an upper surface of the first material within the recess; and a second region along the second sidewall of the recess and in contact with the upper surface of the first material within the recess, wherein the second material is in contact with the first region and the second region; and a further IC component coupled to the IC die, wherein the third material along the first and second sidewalls of the recess is in direct contact with the second material, the first and second sidewalls of the recess, and the upper surface of the first material within the recess.

17. The IC package of claim 16, wherein a height of the first material is less than a height of the recess.

18. The IC package of claim 16, wherein the second material abuts the first region comprising the third material and the second region comprising the third material.

19. The IC package of claim 16, wherein the SAM material is a first SAM material, wherein the first material comprises the first SAM material or an organic material, and wherein the third material comprises a second SAM material, the second SAM material being different from the first SAM material.

20. The IC package of claim 16, wherein the first material, the second material, and the third material fill the recess.

* * * * *